United States Patent
Yamamoto et al.

(10) Patent No.: US 9,362,931 B2
(45) Date of Patent: Jun. 7, 2016

(54) SEMICONDUCTOR DEVICE

(71) Applicant: Renesas Electronics Corporation, Kanagawa (JP)

(72) Inventors: Takaya Yamamoto, Kawasaki (JP); Hideo Nakane, Kawasaki (JP); Keisuke Kimura, Kawasaki (JP); Yuichi Okuda, Kawasaki (JP); Takashi Oshima, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 14/750,242

(22) Filed: Jun. 25, 2015

(65) Prior Publication Data

US 2015/0381192 A1 Dec. 31, 2015

(30) Foreign Application Priority Data

Jun. 27, 2014 (JP) .................................. 2014-132263

(51) Int. Cl.
| | |
|---|---|
| *H03M 1/12* | (2006.01) |
| *H03M 1/00* | (2006.01) |
| *H03M 1/06* | (2006.01) |
| *H03M 1/46* | (2006.01) |
| *H03M 1/10* | (2006.01) |

(52) U.S. Cl.
CPC ............ *H03M 1/002* (2013.01); *H03M 1/0609* (2013.01); *H03M 1/1009* (2013.01); *H03M 1/462* (2013.01); *H03M 1/468* (2013.01)

(58) Field of Classification Search
CPC ... H03M 1/468; H03M 1/0609; H03M 1/462; H03M 1/002; H03M 1/1009
USPC .......................................... 341/120, 155, 161
See application file for complete search history.

(56) References Cited

U.S. PATENT DOCUMENTS

| | | | | |
|---|---|---|---|---|
| 4,254,406 A | * | 3/1981 | Meares ................. | H03M 1/182 324/99 D |
| 5,019,817 A | * | 5/1991 | Ryder ................... | H03M 1/162 341/129 |

(Continued)

FOREIGN PATENT DOCUMENTS

JP 2012-44302 A 3/2012

OTHER PUBLICATIONS

Wenbo Liu et al., A 12b 22.5145MS/s 3.0mW 0.059mm2 CMOS SAR ADC achieving over 90dB SFDR, IEEE International Solid-State Circuits Conference Feb. 2010, pp. 380-38.

*Primary Examiner* — Brian Young
(74) *Attorney, Agent, or Firm* — Mattingly & Malur, P.C.

(57) ABSTRACT

There is provided a semiconductor device using low electric power and a small area which can realize highly accurate calibration. The semiconductor device according to the embodiment includes an A/D conversion unit, and a hold signal generating circuit which is coupled to an input side of the A/D conversion unit, and has a hold period not less than two cycles of the A/D conversion unit. The hold signal generating circuit includes: an SC integrator including an input buffer coupled to the input side of the A/D conversion unit, and feedback capacitor coupled to an input and an output of the input buffer; and a logic circuit which compares an output signal of plural bits outputted from the A/D conversion unit with a first and a second threshold values, and outputs a control signal which controls polarity of the SC integrator according to a comparison result.

16 Claims, 20 Drawing Sheets

(56) References Cited

U.S. PATENT DOCUMENTS

| | | | | |
|---|---|---|---|---|
| 5,148,170 A | * | 9/1992 | Leopold | H03M 3/432 327/114 |
| 5,200,752 A | * | 4/1993 | Goeke | H03M 1/50 341/166 |
| 6,833,803 B2 | * | 12/2004 | Mayfield | H03M 1/1019 341/155 |
| 7,973,694 B2 | * | 7/2011 | Koyama | H03K 7/06 341/155 |
| 2012/0038498 A1 | | 2/2012 | Oshima et al. | |

* cited by examiner

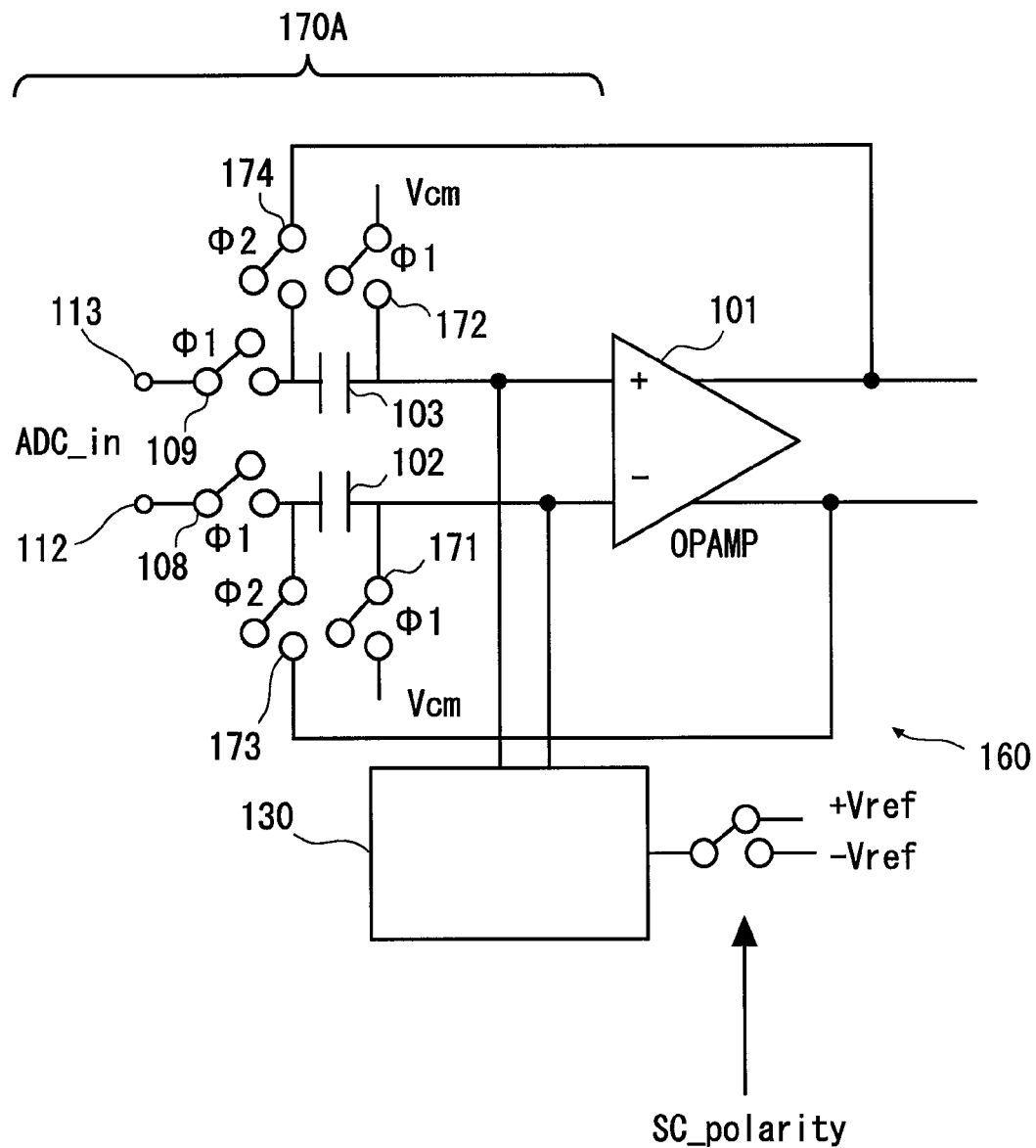
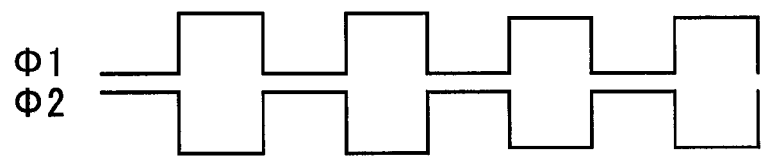
Fig. 18

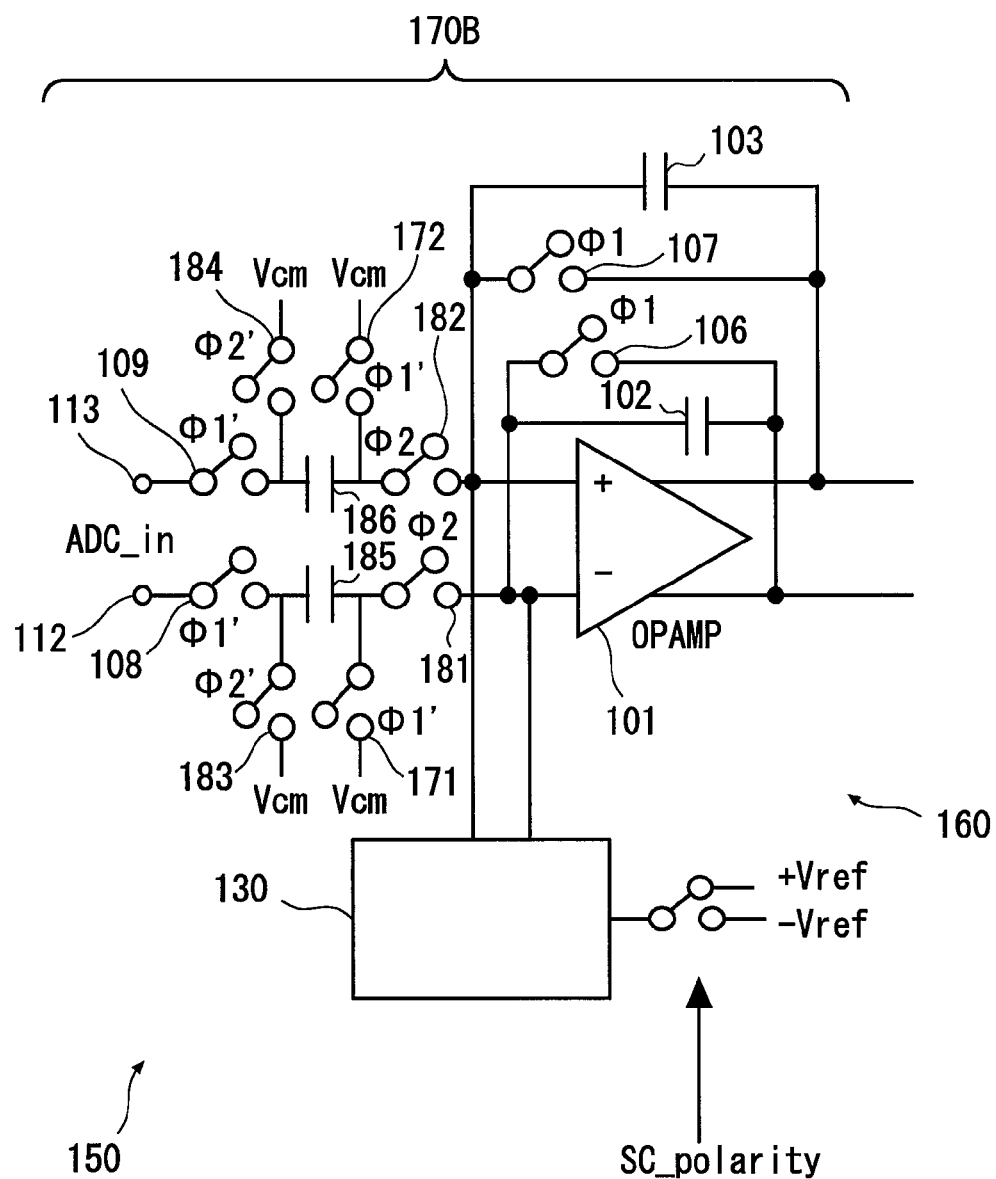
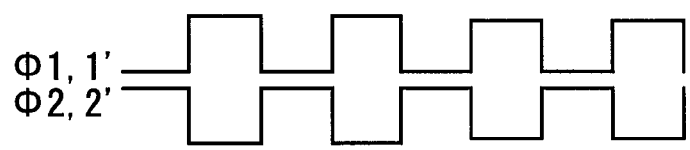
Fig. 19

SEMICONDUCTOR DEVICE

CROSS-REFERENCE TO RELATED APPLICATIONS

This application is based upon and claims the benefit of priority from Japanese patent application No. 2014-132263, filed on Jun. 27, 2014, the disclosure of which is incorporated herein in its entirety by reference.

BACKGROUND

The present invention relates to a semiconductor device.

An ADC, such as an SARADC (Successive Approximation Register Analog Digital Converter) and a pipeline ADC, has a DAC (Digital Analog Converter) in an inside thereof (W. Liu et al., "A 12b 22.5/45 MS/s 3.0 mW 0.059 mm2 CMOS SAR ADC achieving over 90 dB SFDR," IEEE 2010 International Solid-State Circuits Conference, pp. 380-381, February 2010). Distortion of the DAC causes deterioration in accuracy of the whole ADC. There is a technique for realizing highly accurate conversion by calibration correction as the technique for countermeasures against the deterioration in accuracy. As one of these calibration techniques, there is a calibration technique in a digital domain which multiplies a digital code of the ADC by an appropriate weighting coefficient, and compensates for nonlinearity of the DAC. Japanese Unexamined Patent Application Publication No. 2012-44302 discloses as an ADC an A/D converter having cascaded plural MDACs.

SUMMARY

Japanese Unexamined Patent Application Publication No. 2012-44302 proposes one technique for foreground digital calibration. A DAC which generates a reference test signal is provided in an input unit of the ADC as a correction target. In Japanese Unexamined Patent Application Publication No. 2012-44302, the ADC as the correction target performs A/D conversion of an output signal of this reference DAC. The ADC then calculates a correction coefficient using deviation of the conversion result from an ideal value. The reference DAC of FIG. 2 in Japanese Unexamined Patent Application Publication No. 2012-44302 is required to be a highly accurate DAC by ΔΣDAC etc. Therefore, there is a possibility that the reference DAC may have large overhead in area, electric power, etc. in the ADC.

Other problems and new features will be apparent from following description of the present specification and accompanying drawings.

According to one embodiment, a semiconductor device includes a signal generating circuit which has a hold period not less than two cycles of an A/D conversion unit, in which the signal generating circuit includes: a discrete type integrator including an input buffer coupled to an input side of the A/D conversion unit, and a feedback capacitor; and a circuit which compares an output signal of plural bits outputted from the A/D conversion unit with first and second threshold values, and outputs a control signal which controls polarity of the discrete type integrator according to a comparison result.

According to the one embodiment, a semiconductor device which conducts highly accurate calibration while using low electric power and having a small area.

BRIEF DESCRIPTION OF THE DRAWINGS

The above and other aspects, advantages and features will be more apparent from the following description of certain embodiments taken in conjunction with the accompanying drawings, in which:

FIG. 18 is a circuit diagram illustrating a buffer unit of the semiconductor integrated circuit device according to the second embodiment;

FIG. 19 is a circuit diagram illustrating a buffer unit of a semiconductor integrated circuit device according to a modified example of the second embodiment.

DETAILED DESCRIPTION (Entire Configuration)

Figure 1:
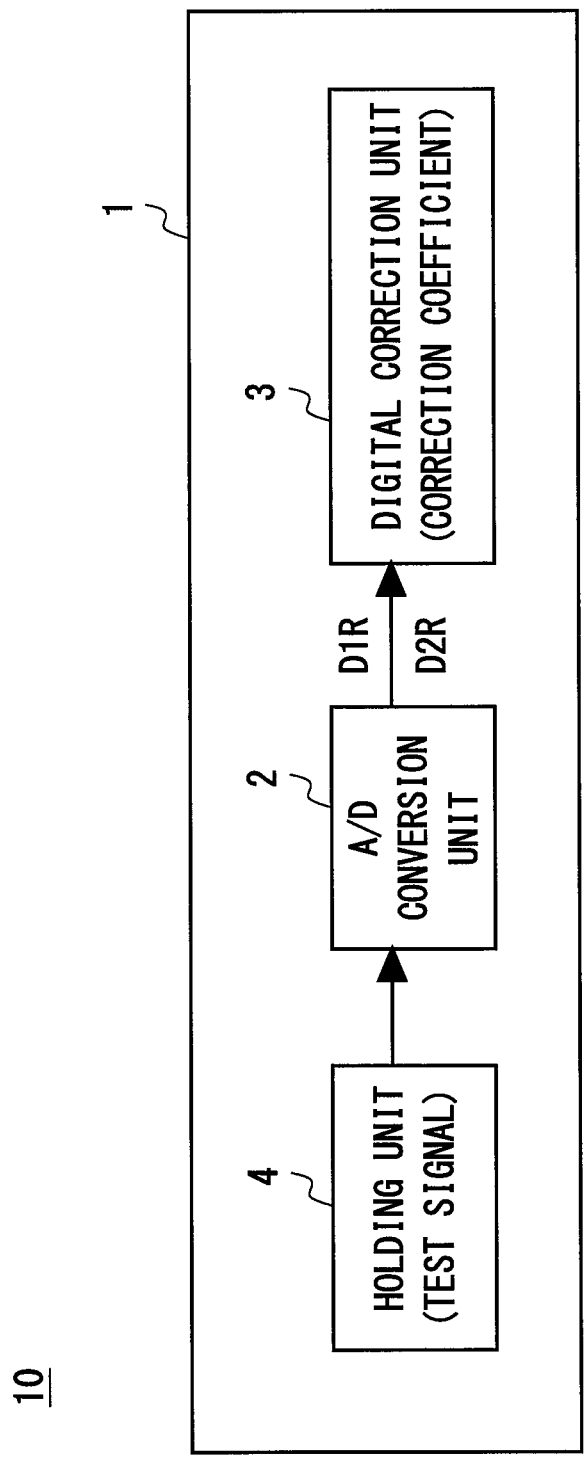
FIG. 1 is a block diagram illustrating one example of an A/D converter which performs digital calibration.
Figure 2:
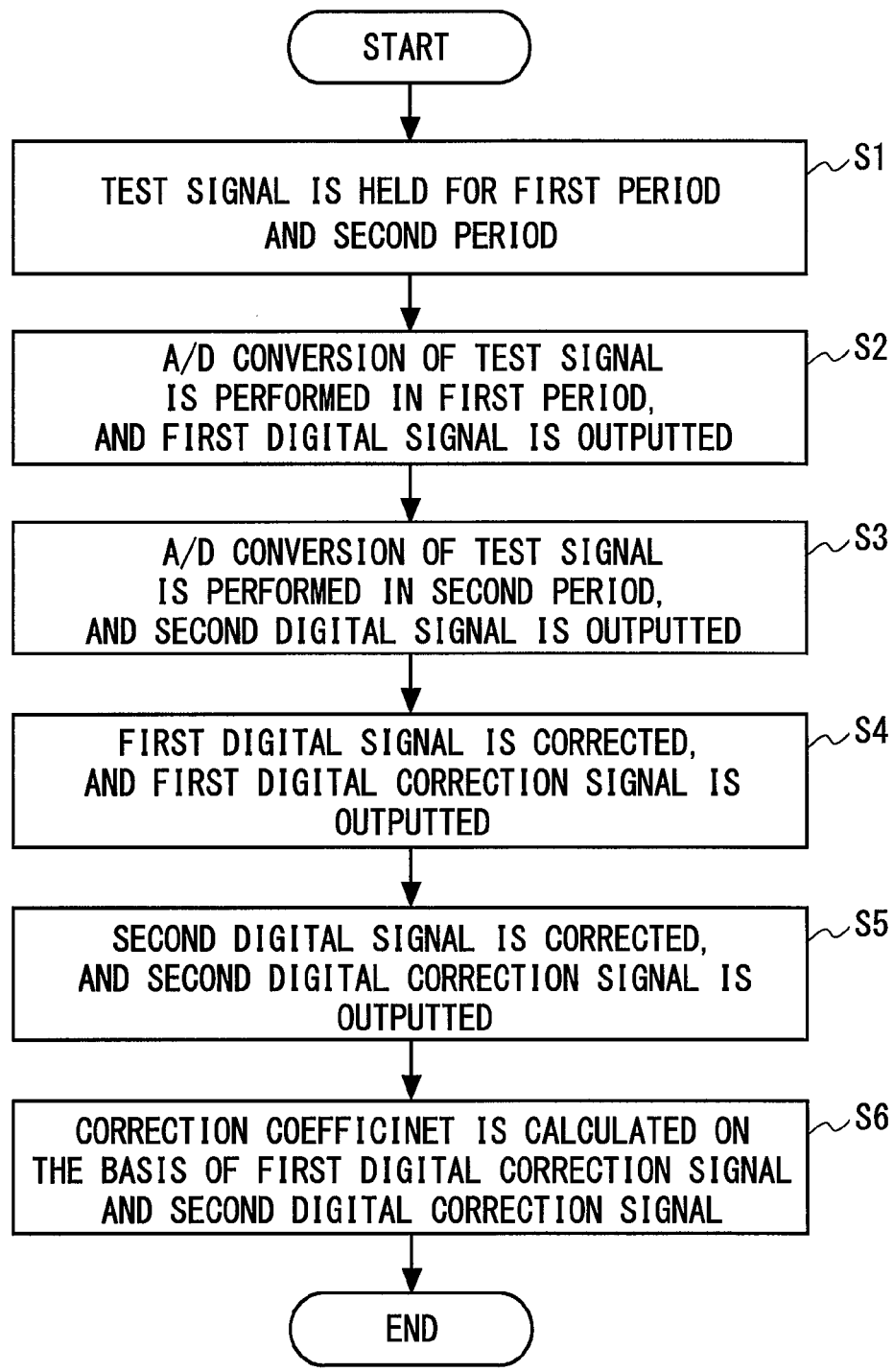
FIG. 2 is an operation flow chart of the A/D converter.

FIG. 1 is a block diagram of an A/D converter according to an embodiment. FIG. 2 is an operation flow chart of the A/D converter according to the embodiment. A semiconductor integrated circuit device (IC) 10 provided with an A/D converter (ADC) 1 has an A/D conversion unit (ADCU) 2, a digital correction unit (DCU) 3, and a holding unit (BUFU) 4. The A/D conversion unit 2 is of a charge sharing type and performs successive approximation. The holding unit 4 holds a test signal. The digital correction unit 3 corrects a digital output signal from the A/D conversion unit 2. It is also preferable that the holding unit 4 is provided in the exterior of the A/D converter 1.

The holding unit 4 holds a test signal for the first period and the second period (Step S1). Here, the second period is a period which follows the first period. In the first period, the A/D conversion unit 2 performs A/D conversion of the test signal, to output a first digital signal (D1R) (Step S2). In the second period, the A/D conversion unit 2 performs A/D conversion of the test signal, to output a second digital signal (D2R) (Step S3). The digital correction unit 3 corrects the first digital signal and outputs a first digital correction signal (Step S4). The digital correction unit 3 corrects the second digital signal and output a second digital correction signal (Step S5). The digital correction unit 3 calculates a correction coefficient on the basis of the first digital correction signal and the second digital correction signal (Step S6).

A semiconductor integrated circuit device 10 has an A/D converter which is provided with an A/D conversion unit of a charge sharing type for performing successive approximation, a digital correction unit for performing digital correction to a digital output received from the A/D conversion unit, and a holding unit for holding a test signal. The test signal of a common value from the holding unit is inputted into the A/D conversion unit in the first period and the second period. An A/D conversion correction coefficient is calculated, on the basis of a digital correction result in the digital correction unit in the first period and a digital correction result in the digital correction unit in the second period. With this configuration, it is possible to realize a digital-correction-type A/D converter provided with an A/D conversion unit which is of a charge sharing type and performs successive approximation, while reducing the size of an exclusive-use analog circuit to be added in order to calculate the A/D conversion correction coefficient.

(Problem of Digital Calibration)

Hereinafter, a problem of foreground digital calibration is explained in detail, with reference to drawings. The problem explained hereinafter is the problem which became apparent by the inventors of the present application.

In the following embodiments, when there is the necessity for convenience, the explanation will be divided into plural sections or plural embodiments. However, unless otherwise specified, they are not irrelevant with each other but they have a relationship that one is a modified example, an application, detailed explanation, supplementary explanation, etc. of a part or all of the other. In addition, in the following embodiments, when the number of elements, etc. (including the number, a numeric value, quantity, a range, etc.) are referred to, the number of elements may be not restricted to a specific number but may be not less than or not more than the specific number, except for the case where it is specified in particular or clearly restricted to the specific number in principle.

Furthermore, in the following embodiments, the component (including operation, a timing chart, an element step, an operation step, etc.) is not necessarily essential, except for the case where it is explicitly specified in particular or it is considered in principle that it is clearly essential. Similarly, in the following examples, when referring to the shape, positional relationship, etc. of a component etc., what is analogous or similar substantially to the shape, positional relationship etc. shall be included, except for the case where it is specified in particular or clearly not considered to be so in principle. The same applies to the number of elements etc. (including the number, a numeric value, quantity, a range, etc.) described above.

In the entire drawings for explaining the embodiments, the same or a related symbol is attached to the region and the member which have the same function, and the repeated explanation thereof is omitted. In addition, in the following embodiments, except when necessary in particular, the repeated explanation of the same or a similar part is omitted in principle.

Specific examples of the A/D converter 1 and the semiconductor integrated circuit device 10 illustrated in FIG. 1 are explained hereinafter. The A/D converter 1 and the semiconductor integrated circuit device 10 explained hereinafter schematically illustrate a circuit configuration assumed by the inventors of the present application.

1. Configuration

Figure 3:
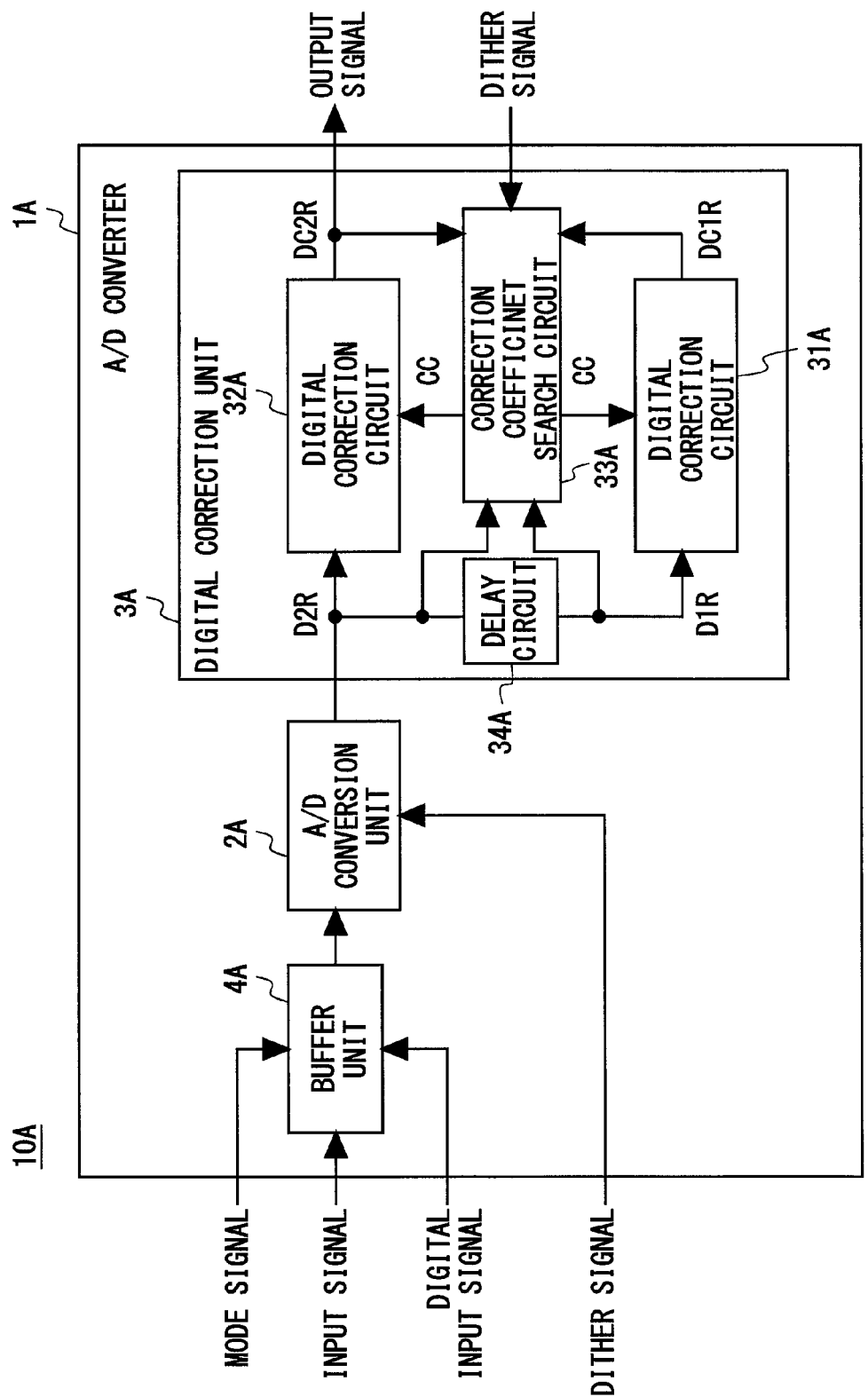
FIG. 3 illustrates the A/D converter.
Figure 4:
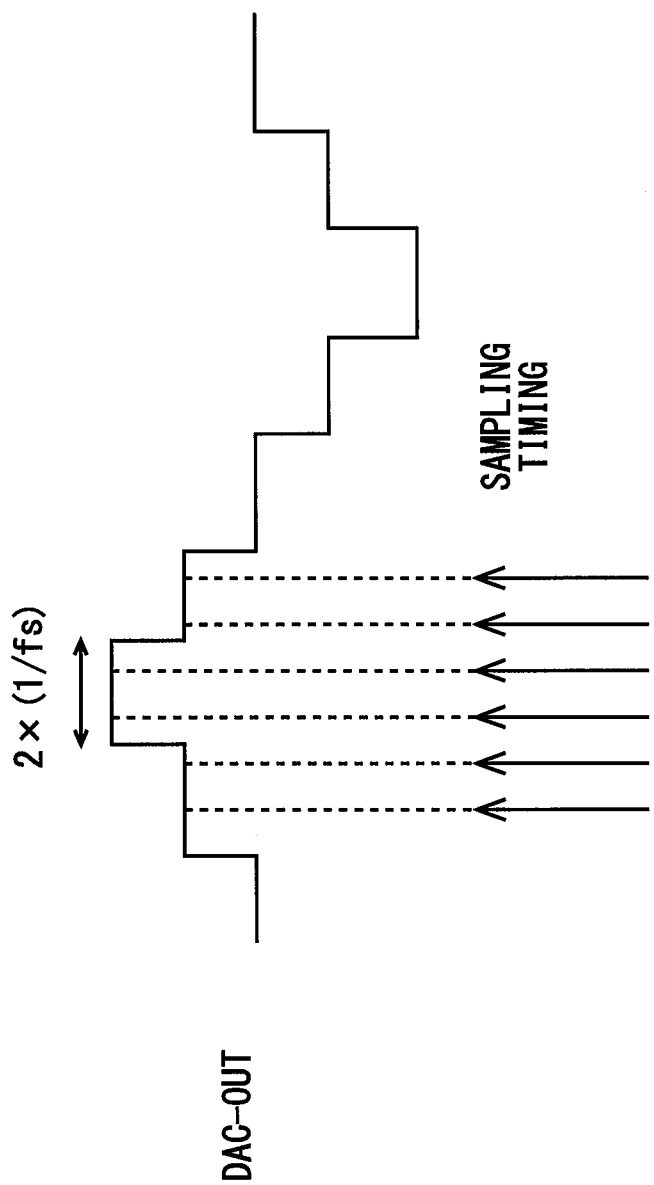
FIG. 4 is a waveform chart of an output signal of a buffer unit of the A/D converter.
Figure 5:
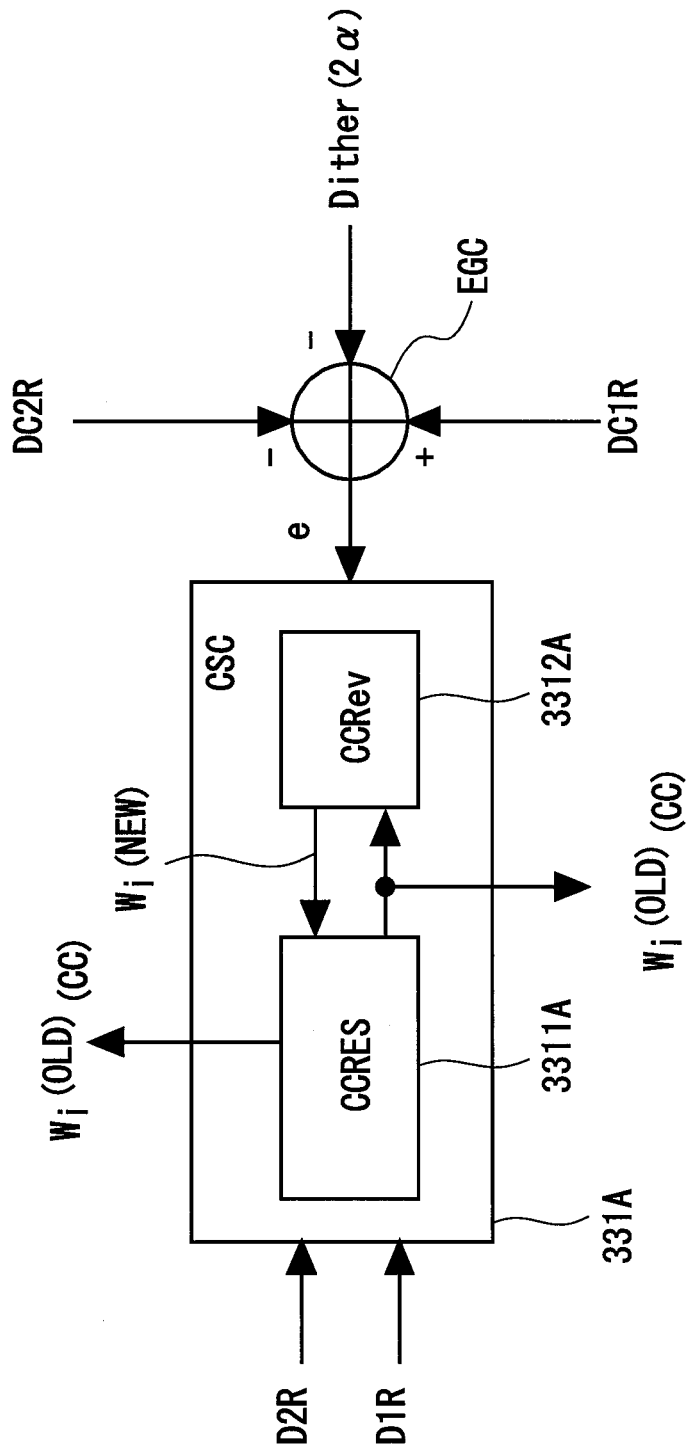
FIG. 5 is a block diagram of a correction coefficient search circuit.

FIG. 3 is a block diagram illustrating one example of an A/D converter. FIG. 4 is a waveform chart of an output signal of a buffer unit. FIG. 5 is a block diagram of a correction coefficient search circuit. As illustrated in FIG. 3, an A/D converter (ADC) 1A has a buffer unit (BUFU) 4A, an A/D conversion unit (ADCU) 2A, and a digital correction unit (DCU) 3A. The A/D converter 1A is formed on one semiconductor substrate as a part of a semiconductor integrated circuit device 10A.

The digital correction unit 3A has digital correction circuits 31A and 32A, a correction coefficient search circuit (CCSC) 33A, and a delay circuit (DL) 34A. Here, the digital correction circuit 31A and the digital correction circuit 32A are the same circuit.

The buffer unit 4A receives a digital input signal (DAC-IN), and generates an output signal (DAC-OUT) as a test signal for A/D conversion. The A/D conversion unit 2A receives the output signal (DAC-OUT) and performs A/D converting thereto, to output the converted signal to the digital correction unit 3A. Here, the output signal (DAC-OUT) changes its value for every two conversion cycles (2/fs) of the A/D conversion unit 2A, as illustrated in FIG. 4. In other words, the same value is held for two conversion cycles (2/fs). The A/D conversion unit 2A performs the A/D converting twice to the output signal (DAC-OUT) having the same value. The first A/D converting is performed in the first period as the first conversion cycle (1/fs) of the two conversion cycles (2/fs) during which the output signal (DAC-OUT) of the same value is held. As the result, a first A/D conversion result (D1R) is outputted to the digital correction unit 3A. The second A/D converting is performed in the second period as the latter conversion cycle (1/fs) of the two conversion cycles (2/fs) during which the output signal (DAC-OUT) of the same value is held. As the result, a second A/D conversion result (D2R) is outputted to the digital correction unit 3A. A dither signal component (Dither) (a value thereof is α) is included in at least either of the first A/D conversion result (D1R) and the second A/D conversion result (D2R). The digital correction unit 3A performs digital correcting to the first A/D conversion result (D1R) and the second A/D conversion result (D2R). On the basis of a correction result (DC1R) of the first A/D conversion result (D1R) and a correction result (DC2R) of the second A/D conversion result (D2R), the digital correction unit 3A calculates a correction coefficient (CC) for the digital correcting. The delay circuit 34A delays the correction result (DC1R) of the first A/D conversion result (D1R) or the first A/D conversion result (D1R) by one conversion cycle (1/fs), in order that the digital correction unit 3A may process in parallel the correction result (DC1R) of the first A/D conversion result (D1R) and the correction result (DC2R) of the second A/D conversion result (D2R).

2. Test Operation

Figure 6:
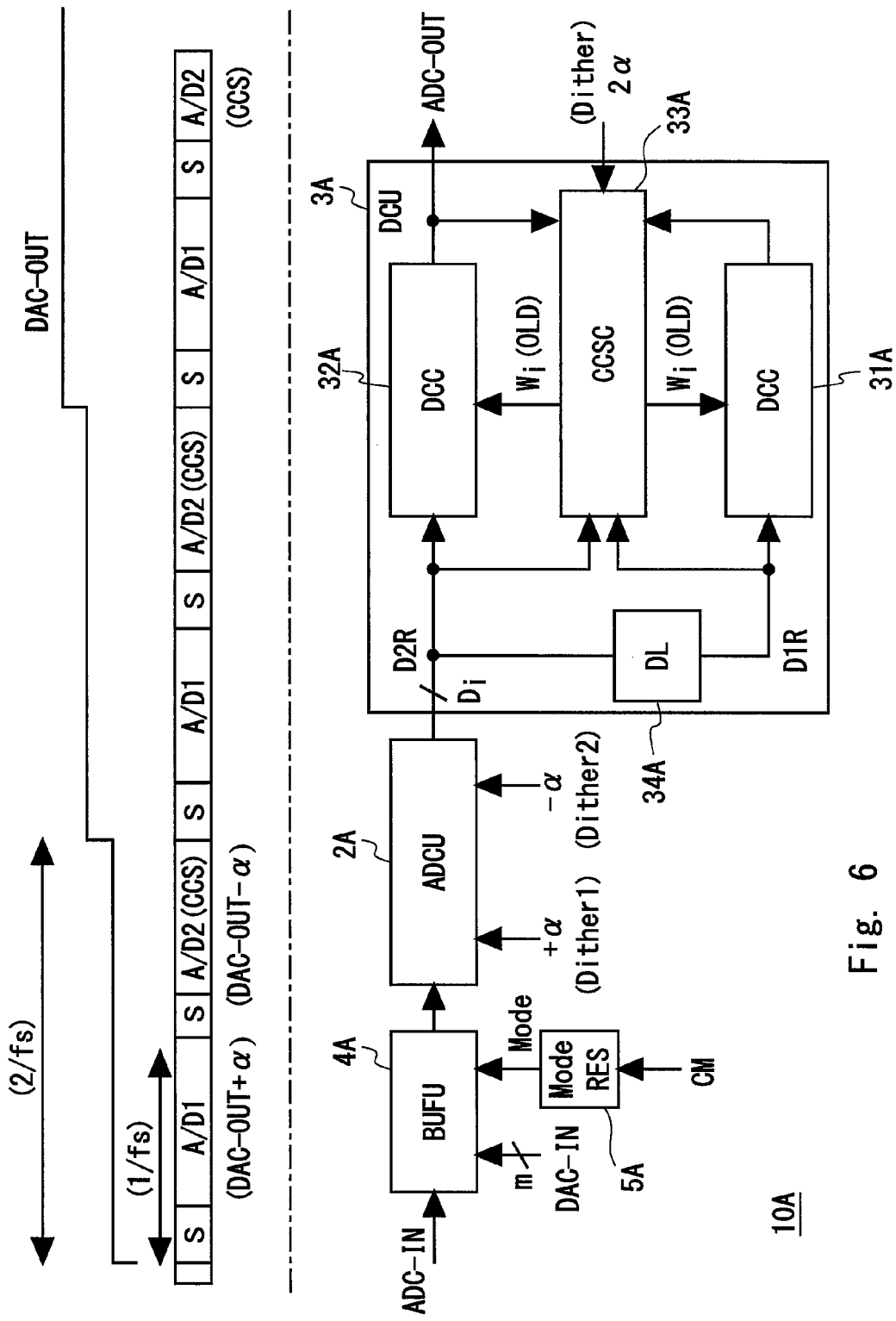
FIG. 6 illustrates a configuration of a semiconductor integrated circuit device, and a timing flow in an A/D conversion test operation of the A/D converter.

FIG. 6 illustrates a configuration of the semiconductor integrated circuit device, and a timing flow in an A/D conversion test operation of the A/D converter. The configuration of the semiconductor integrated circuit device and the operation at the time of the A/D conversion test operation of the A/D converter are explained with reference to FIGS. 6 and 5.

The semiconductor integrated circuit device 10A has a mode register (ModeRES) 5A for setting an operation mode. At the time of the A/D conversion test operation, an A/D conversion correction mode (CM) is set to the mode register 5A. FIG. 6 illustrates the operation in the A/D conversion test operation.

The buffer unit 4A has a function as an input buffer circuit for receiving an input signal (ADC-in) inputted into the A/D converter 1A, and a function as a D/A converter for generating the output signal (DAC-OUT) to be inputted into the A/D conversion unit 2A. According to a mode signal (Mode) from the mode register 5A, it is selected whether the buffer unit 4A functions as the input buffer circuit or it functions as the D/A converter. Hereinafter, digital to analog conversion is called D/A conversion and a digital to analog converter is called the D/A converter.

The A/D conversion unit 2A performs A/D converting to an output from the buffer unit 4A, to output a digital output signal (D1) to a latter stage. A first dither signal (Dither1) and a second dither signal (Dither2) can be inputted into the A/D conversion unit 2A. The second dither signal (Dither2) is equal in absolute value but different in sign with the first dither signal (Dither1). Here, the dither signal is a DC offset applied voltage for calculating effectively the correction coefficient (CC) for use in the digital correcting. It is more preferable that there exist two dither signals such as the first dither signal (Dither1) and the second dither signal (Dither2); however, it suffices that there exists either of them. Furthermore, if it is permissible to take time in the correction coefficient search, any dither signal may not be applied.

At the time of an actual A/D conversion operation to be explained later, the digital correction unit 3A performs digital correction to the output from the A/D conversion unit 2A, to generate an output signal (ADC-OUT). At the time of the A/D conversion test operation, the correction coefficient search circuit 33A calculates a correction coefficient (CC) on the basis of the output from the A/D conversion unit 2A.

The second digital correction circuit 32A performs digital correcting to a digital output from the A/D conversion unit 2A, to output the corrected signal to the latter stage. The first digital correction circuit 31A also performs digital correcting to the digital output from the A/D conversion unit 2A, to output the corrected signal to the latter stage. However, compared with the digital output inputted into the second digital correction circuit 32A, the digital output inputted into the first digital correction circuit 31A is delayed by one conversion cycle (1/fs) by the delay circuit 34A.

As illustrated in FIG. 5, the correction coefficient search circuit 33A has a conversion error generating circuit EGC and a coefficient search circuit (CSC) 331A. The conversion error generating circuit EGC calculates a difference of the output from the first digital correction circuit 31A and the output from the second digital correction circuit 32A, and further subtracts $2\alpha$ from the difference, thereby obtaining a conversion error (e) to output. Here, $2\alpha$ is a value obtained when the second dither signal (Dither2) is subtracted from the first dither signal (Dither1), where $\alpha$ expresses a value of the dither signal (Dither).

The coefficient search circuit 331A has a correction coefficient register (CCRES) 3311A and a correction coefficient calculation circuit (CCRev) 3312A. The correction coefficient calculation circuit 3312A makes searching in order to determine a correction coefficient (CC), on the basis of the conversion error (e). The correction coefficient (CC) is stored in the correction coefficient register 3321A in the coefficient search circuit 331A.

At the time of the A/D conversion test operation, the digital input signal (DAC-IN) is inputted into the buffer unit 4A, D/A converting of the digital input signal (DAC-IN) is performed, and the output signal (DAC-OUT) as an analog signal is outputted to the A/D conversion unit 2A. Here, the digital input signal (DAC-IN) is a digital signal of m bits (m is a natural number of 2 or greater). In the whole present specification, operation to generate the correction coefficient to be used in the digital correcting for A/D conversion is defined as the A/D conversion test operation.

As illustrated in the timing flow of the upper-row drawing of FIG. 6, the A/D conversion unit 2A samples the output signal (DAC-OUT) in a sampling period (S). Subsequently, the A/D conversion unit 2A performs A/D converting to the sampled output signal (DAC-OUT) and the first dither signal (Dither1) added to the A/D conversion unit 2A in a first A/D conversion period (A/D1), and outputs the first A/D conversion result (D1R) as a digital signal. Furthermore, the A/D conversion unit 2A samples the output signal (DAC-OUT) in the sampling period (S). Subsequently, the A/D conversion unit 2A performs A/D converting to the sampled output signal (DAC-OUT) and the second dither signal (Dither2) added to the A/D conversion unit 2A in a second A/D conversion period (A/D2), and outputs the second A/D conversion result (D2R) as a digital signal. The delay circuit 34A delays the first A/D conversion result (D1R) by one conversion cycle (1/fs), and outputs it to the first digital correction circuit 31A. Here, one conversion cycle (1/fs) is a period of the sampling period (S) plus the first A/D conversion period (A/D1). In addition, the first A/D conversion period (A/D1) and the second A/D conversion period (A/D2) are equal. As a result, timing at which the first A/D conversion result (D1R) is inputted into the first digital correction circuit 31A and timing at which the second A/D conversion result (D2R) is inputted into the second digital correction circuit 32A become the same period. Here, the output signal (DAC-OUT) used to calculate the first A/D conversion result (D1R) and the output signal (DAC-OUT) used to calculate the second A/D conversion result (D2R) have the same value, as illustrated in FIG. 6. This is because the buffer unit 4A holds the output signal (DAC-OUT) for two conversion cycles (2/fs).

The first digital correction circuit 31A and the second digital correction circuit 32A output to the conversion error generating circuit EGC results of digital correction performed to the first A/D conversion result (D1R) and the second A/D conversion result (D2R), respectively, with the use of the correction coefficient (CC) (labeled as Wi (OLD) in FIG. 6). The correction coefficient (CC) is a coefficient for performing digital correction to the first digital correction circuit 31A and the second digital correction circuit 32A.

Here, it is assumed that the first A/D conversion result (D1R) and the second A/D conversion result (D2R) are Di. Additionally, it is assumed that the correction coefficient (CC) is Wi. Then, a value given by the following expression (1) is outputted from the first digital correction circuit 31A and the second digital correction circuit 32A. Here, i takes a value of from 0 to N−1 and indicates the i-th bit of the digital output signal of the A/D conversion unit 2A. N is a natural number of 2 or greater, and indicates the number of bits.

$$\Sigma_{i=0}^{N-1} W_i D_i. \tag{1}$$

The conversion error generating circuit EGC generates a conversion error (e) by subtracting the result (DC2R) of the digital correction performed to the second A/D conversion result (D2R) from the result (DC1R) of the digital correction performed to the first A/D conversion result (D1R), and further subtracting $2\alpha$ from the remains. The timing at which the result (DC1R) of the digital correction performed to the first A/D conversion result (D1R) is inputted, and the timing at which the result (DC2R) of the digital correction performed to the second A/D conversion result (D2R) is inputted become the same period due to the delaying operation by the delay circuit 34A. On the basis of this conversion error (e), the correction coefficient calculation circuit 3312A makes searching, in order to determine a correction coefficient (CC) by an LMS algorithm. Here, the LMS algorithm is an abbreviated name for the Least Mean Squares algorithm, and is a class of the adaptive control systems. In the LMS algorithm, assuming that input data is Di, an output is A, and a coefficient is Wi, then Wi is estimated from a large number of samples of Di and A, for which it is known that a relation A=ΣWi*Di is true.

The correction coefficient calculation circuit 3312A calculates a correction coefficient (CC) with a predetermined algorithm, such as the LMS algorithm, according to the conversion error (e), the first A/D conversion result (D1R), the second A/D conversion result (D2R), and the correction coefficient (CC). Here, the correction coefficient (CC) is the one which is stored in the correction coefficient register 3311A in advance (labeled as Wi (OLD) in FIG. 6). The newly calculated correction coefficient (CC) (labeled as Wi (NEW) in FIG. 5) is newly stored in the correction coefficient register 3311A.

Furthermore, the following output signal (DAC-OUT) is inputted into the A/D conversion unit 2A. Since this output signal (DAC-OUT) is inputted after 2 conversion cycles (2/fs), a value thereof differs from the last output signal. Accordingly, the value of the correction coefficient register 3311A is updated. Such an updating operation is repeated at the time of the A/D conversion test operation.

In this way, the correction coefficient (CC) is searched for on the basis of the result (DC1R) of the digital correction performed to the first A/D conversion result (D1R) which has been delayed by the delay circuit 34A, and the result (DC2R) of the digital correction performed to the second A/D conversion result (D2R). Therefore, the correction coefficient search period (CCS), during which the correction coefficient (CC) is searched for by the correction coefficient calculation circuit 3312A, takes place whenever the second A/D conversion period (A/D2) takes place.

3. Actual Operation (Normal Operation)

Figure 7:
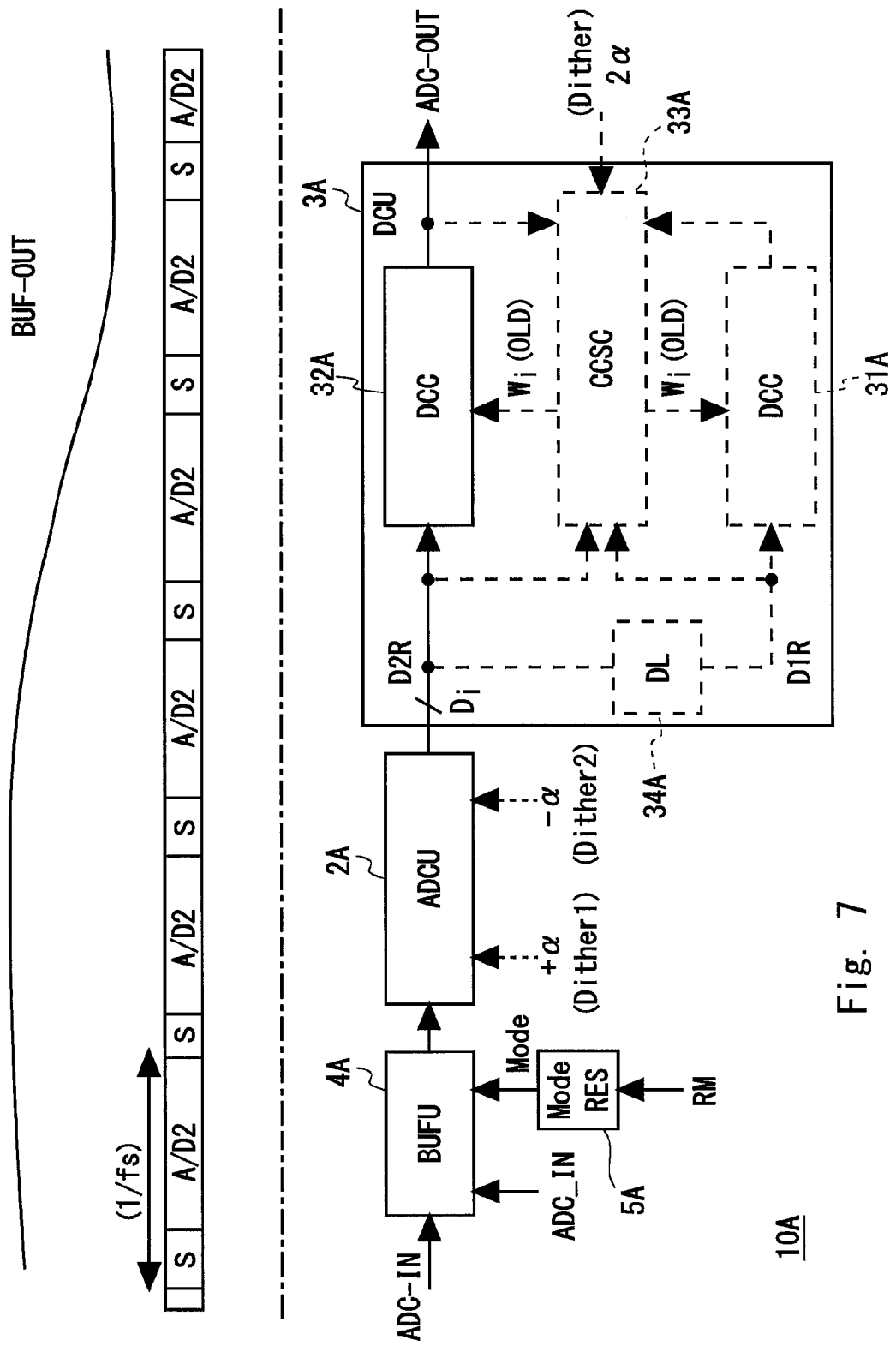
FIG. 7 illustrates a configuration of the semiconductor integrated circuit device, and a timing flow in an actual A/D conversion operation of the A/D converter.

FIG. 7 illustrates a configuration of the semiconductor integrated circuit device, and a timing flow in an actual A/D conversion operation of the A/D converter.

The circuit configuration of the semiconductor integrated circuit device 10A is the same as that illustrated in FIG. 6. An actual A/D conversion operation mode (RM) is set to the mode register 5A.

At the time of the actual A/D conversion operation, the buffer unit 4A is supplied with an input signal (ADC-in) and outputs an output signal (BUF-OUT). As illustrated in the timing flow of the upper part of FIG. 7, the output signal (BUF-OUT) is sampled in a sampling period (S). Subsequently, the A/D conversion unit 2A performs A/D converting to the sampled output signal (BUF-OUT) in the second A/D conversion period (A/D2), and outputs the second A/D conversion result (D2R) as a digital signal. Next, the digital correction circuit 32A performs digital correction to the second A/D conversion result (D2R) with the use of the correction coefficient (CC) calculated in the A/D conversion test operation. A result after the digital correction becomes an output signal (ADC-OUT), and is outputted as an A/D conversion result of the A/D converter 1. The operation as described above is repeated for every conversion cycle (1/fs). The first digital correction circuit 31A, the delay circuit 34A, and the correction coefficient search circuit 33A, which are illustrated by dotted blocks, do not operate basically in the A/D conversion normal operation. However, the correction coefficient (CC) is held in the correction coefficient search circuit 33A, and outputted to the second digital correction circuit 32A. In addition, a D/A conversion circuit of the buffer unit 4A does not operate also. Furthermore, a dither signal is not applied to the A/D conversion unit 2A. In the present specification, the actual A/D conversion operation means that after A/D converting is performed to the inputted analog signal, digital correcting is performed to the A/D conversion result with the use of the correction coefficient (CC) calculated in the A/D conversion test operation, thereby executing A/D converting of the A/D converter.

4. A/D Conversion Unit

Figure 8:
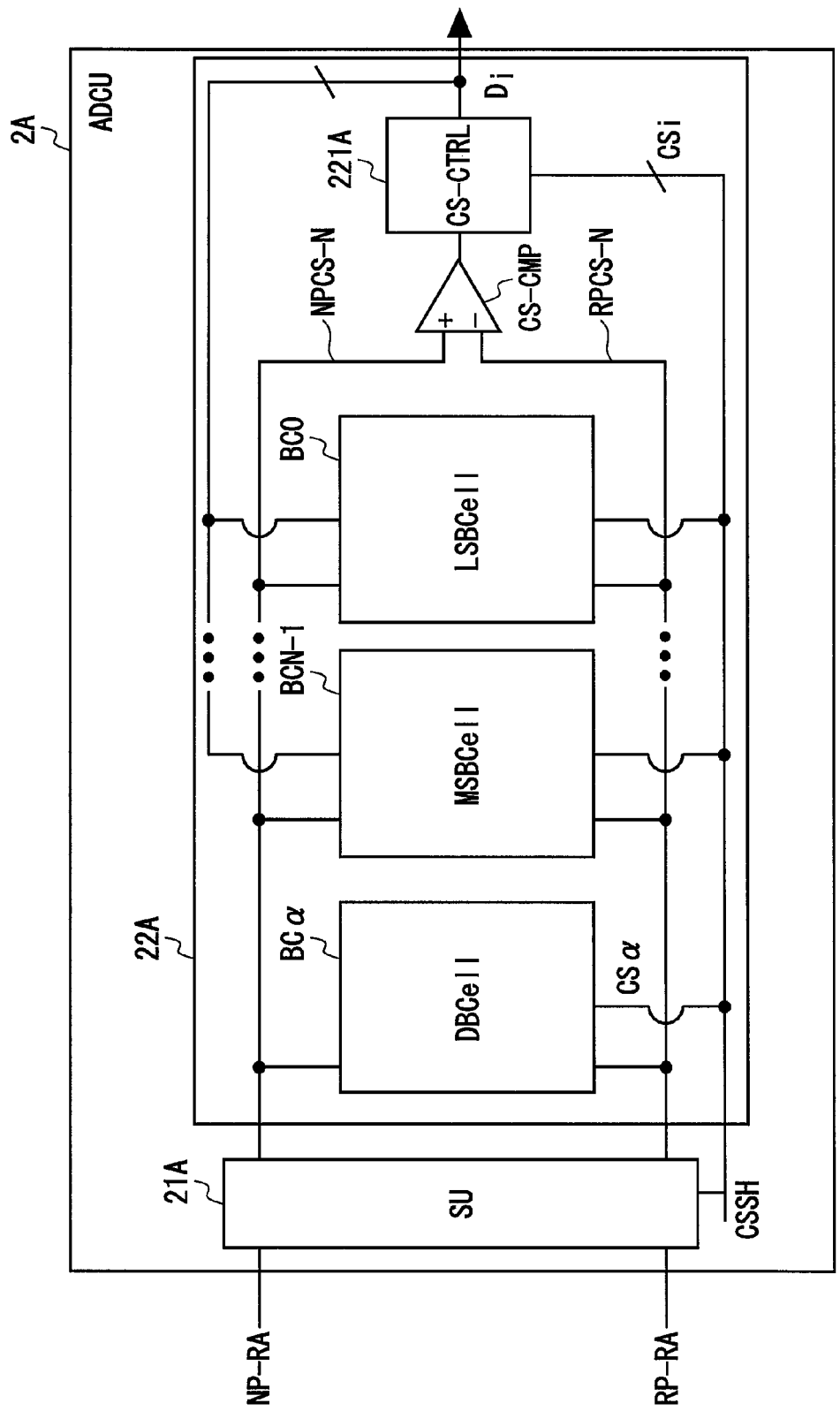
FIG. 8 illustrates a configuration of an A/D conversion unit.
Figure 9:
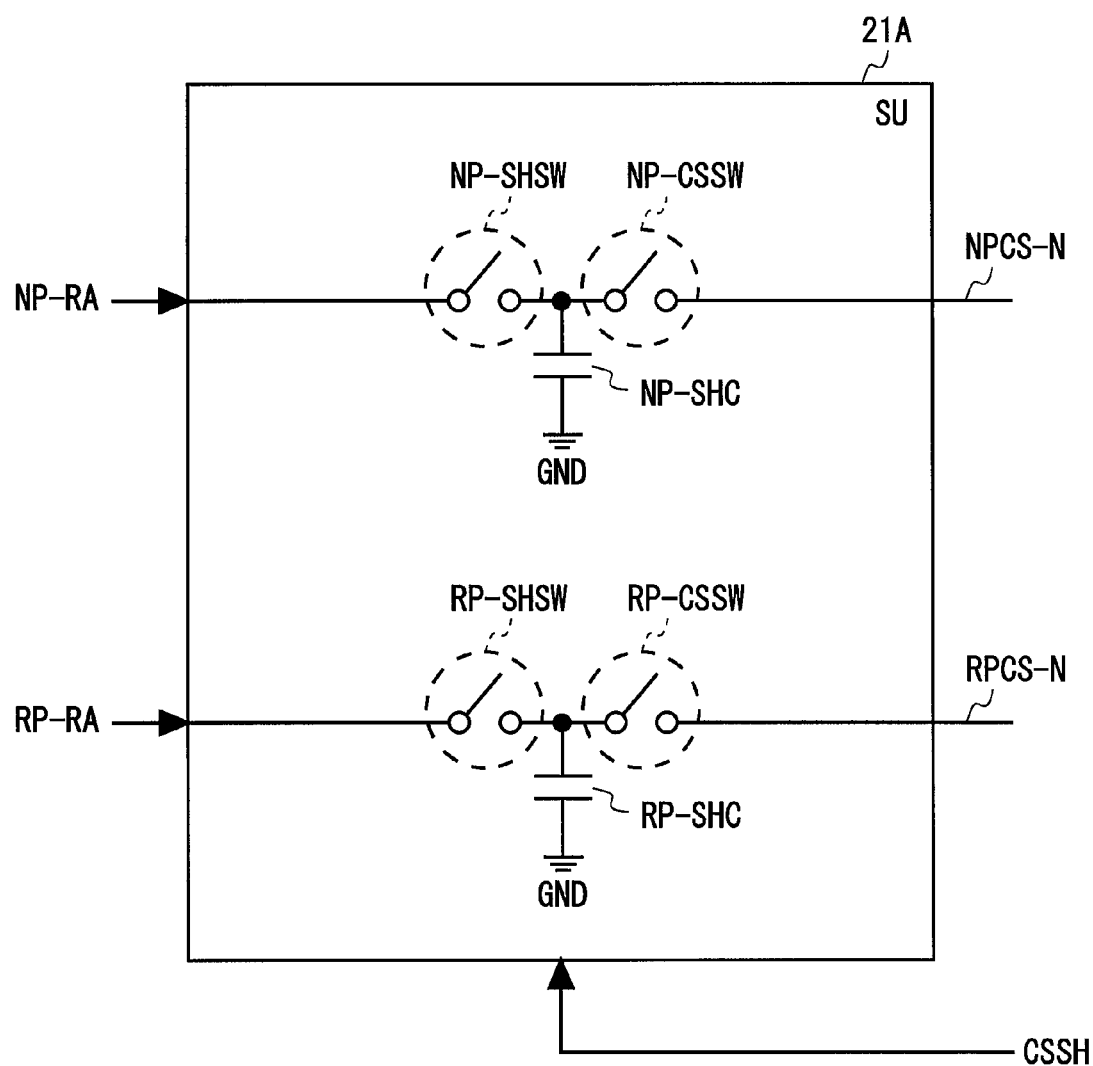
FIG. 9 illustrates a sample hold circuit and a switching circuit for charge sharing.
Figure 10:
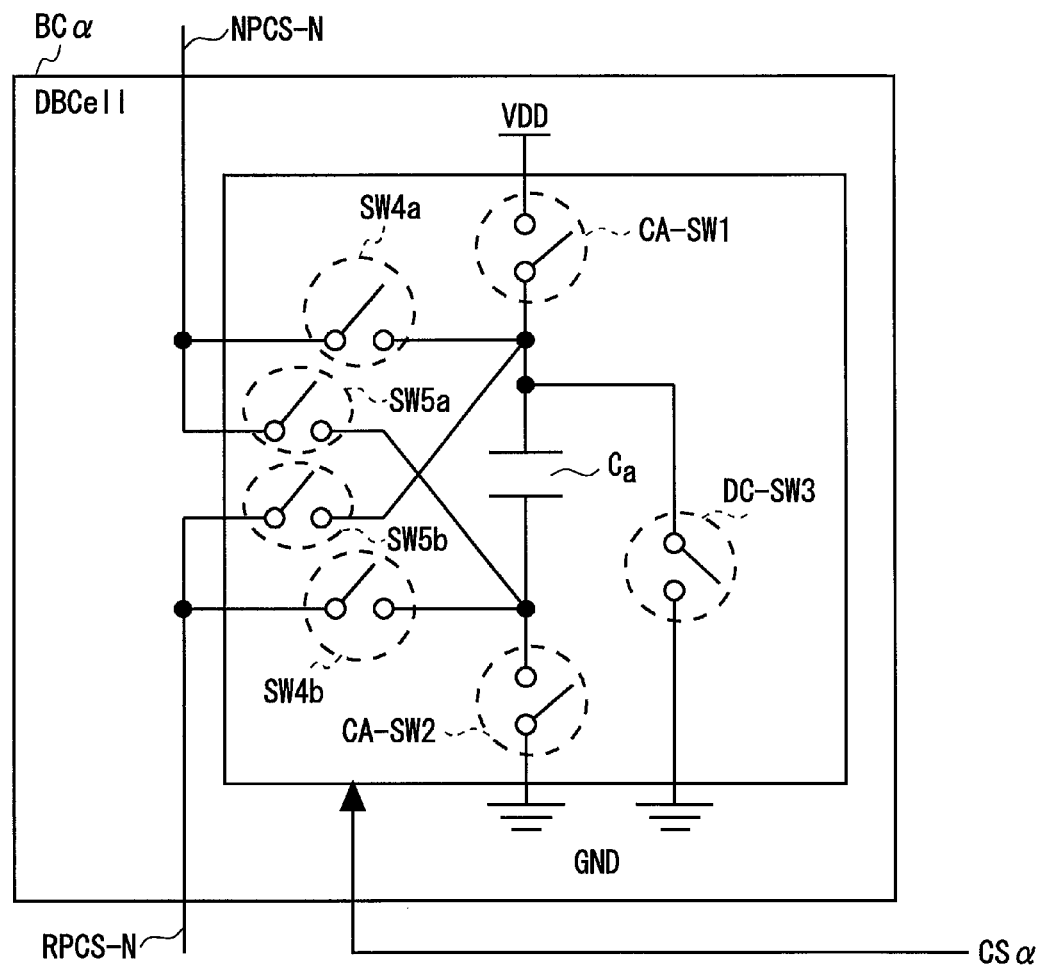
FIG. 10 is a circuit diagram of a dither signal bit cell.
Figure 11:
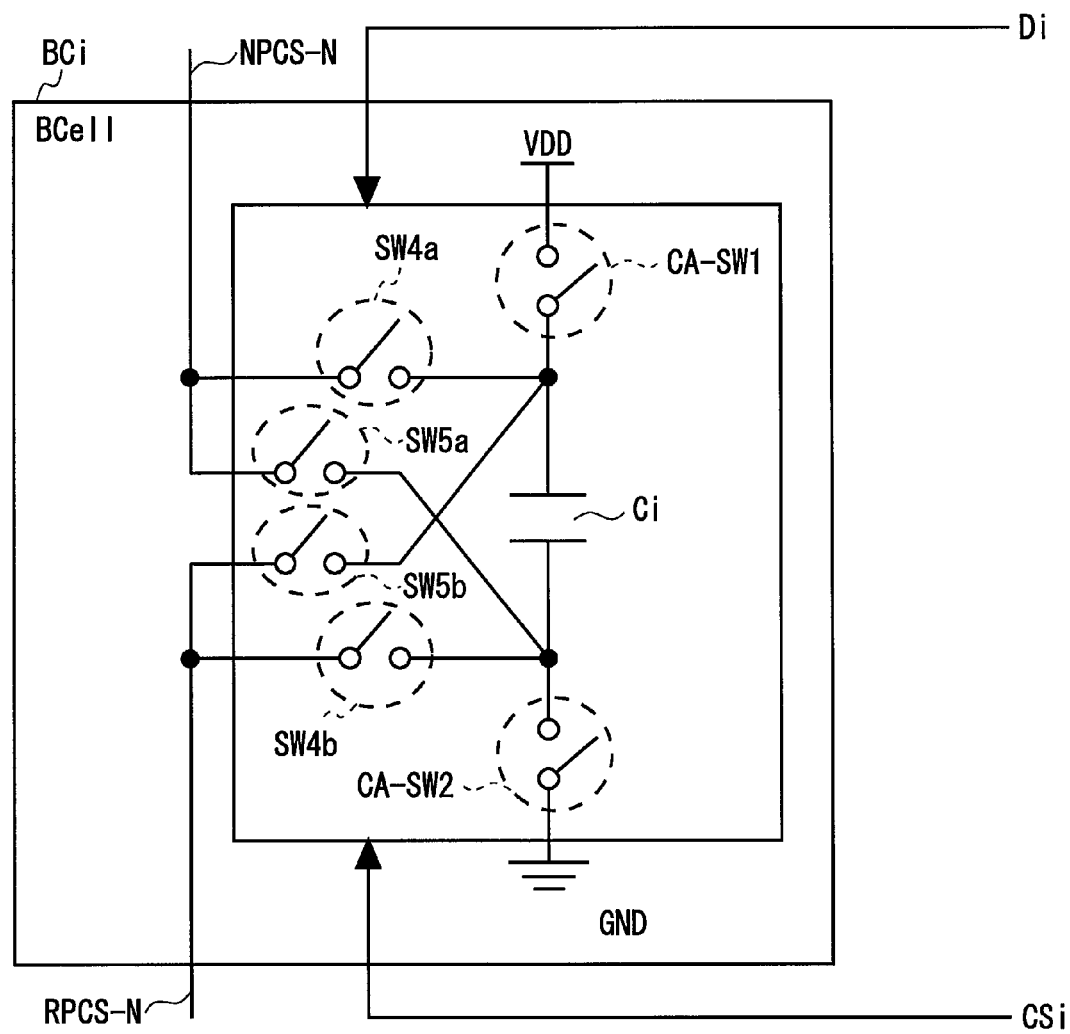
FIG. 11 is a circuit diagram of a bit cell.

FIG. 8 illustrates a configuration of the A/D conversion unit. FIG. 9 illustrates a sample hold circuit and a switching circuit for charge sharing. FIG. 10 is a circuit diagram of a dither signal bit cell. FIG. 11 is a circuit diagram of a bit cell.

The A/D conversion unit 2A is designed to treat a single phase signal; however, it is also preferable to treat a differential signal. The A/D conversion unit 2A illustrated in FIG. 8 is configured so as to treat a differential signal as the input signal and a single phase signal as the output signal.

(1) Configuration

As illustrated in FIG. 8, the A/D conversion unit (ADCU) 2A has a sampling circuit (SU) 21A and a conversion circuit (CU) 22A. The conversion circuit 22A has a comparator CS-CMP, a control circuit (CS-CTRL) 221A, plural bit cells (BCell) BC0 to BCN−1, and BCα. Here, BCell is a generic name for plural bit cells from a bit cell for the least significant bit (LSBCell) to a bit cell for the most significant bit (MSBCell), and a dither signal bit cell (DBCell). The A/D conversion unit 2A receives a reception analog differential signal including an analog signal (NP-RA) and an analog signal (RP-RA) which is in an inversion relation with the analog signal (NP-RA). Here, the analog signal (NP-RA) is a non-inverted signal of the output signal (DAC-OUT) at the time of the A/D conversion test operation, and a noninverted signal of the output signal (BUF-OUT) at the time of the actual A/D conversion operation. The analog signal (RP-RA) is an inverted signal of the output signal (DAC-OUT) at the time of the A/D conversion test operation, and an inverted signal of the output signal (BUF-OUT) at the time of the actual A/D conversion operation.

As illustrated in FIG. 9, a switch NP-SHSW receives the analog signal (NP-RA). A switch RP-SHSW receives the analog signal (RP-RA). A capacitor NP-SHC samples and holds the analog signal (NP-RA). A capacitor RP-SHC samples and holds the analog signal (RP-RA). A switch NP-CSSW is coupled to the capacitor NP-SHC for sharing a charge between the capacitor NP-SHC and the bit cell (BCell). A switch RP-CSSW is coupled to the capacitor RP-SHC for sharing a charge between the capacitor RP-SHC and the bit cell (BCell).

A node NPCS-N is provided between a noninverting input terminal of the comparator CS-CMP and the capacitor NP-SHC. A node RPCS-N is provided between an inverting input terminal of the comparator CS-CMP and the capacitor RP-SHC. The comparator CS-CMP compares a voltage between the node NPCS-N and the node RPCS-N.

In response to a comparison result of the comparator CS-CMP, the control circuit 221A generates a digital output signal (D1) of the A/D conversion unit 2A, outputs it to the digital correction unit 3A, and controls the bit cell (BCell).

The bit cell (BCell) has bit cells of the number of bits of the digital output signal (D1) plus one. That is, the bit cell (BCell) has a dither signal bit cell (DBCell) BCα, and bit cells BC0 to BCN−1 for the number of bits of the digital output (Di) (the other bit cells (LSBCell, MSBCell, etc.)). As illustrated in FIG. 10, the dither signal bit cell BCα has a dither signal capacitor Cα, a switch CA-SW1, a switch CA-SW2, and a switch DC-SW3. Furthermore, the dither signal bit cell BCα has two switches SW4a and SW4b, and two switches SW5a and SW5b. A coupling relation thereof is as illustrated in the figure. The dither signal capacitor Cα has a capacitance value according to a voltage value to be given by the dither signal.

The other bit cells BC0 to BCN−1 are N cells, and a configuration thereof is basically the same as that of the dither signal bit cell BCα, except that, as illustrated in FIG. 11, the switch DC-SW3 is not provided and the data output signal (D1) and the control signal (CSi) are inputted. Furthermore, a bit cell capacitor Ci is provided in lieu of the dither signal capacitor Cα. The bit cell capacitor Ci satisfies the following relations.

(A) 0≤i≤N−1, is 0 or a natural number, N is 2 or a greater natural number, and (B) a capacitance value of a bit cell capacitor Ci+1 of the (i+1)th bit cell is about twice a capacitance value of a bit cell capacitor Ci of the i-th bit cell.

The (N−1)th bit cell (BCell) corresponding to a maximum bit of the digital output signal (D1) is the bit cell for the most significant bit (MSBCell) BCN−1, and the 0th bit cell (BCell) corresponding to a minimum bit is the bit cell for the least significant bit (LSBCell) BC0. A ground voltage (GND) and a power supply voltage (VDD) are supplied to the bit cell (BCell).

(2) Operation (a) A/D Conversion Test Operation

The operation at the time of executing the A/D conversion test operation is explained hereinafter.

(A) First Timing

At the first timing, the analog signal (NP-RA) and the analog signal (RP-RA) are sampled to the capacitor NP-SHC and the capacitor RP-SHC, respectively, on the basis of the control signal (CSSH). Then, in order to charge the charge corresponding to a voltage of the power supply voltage (VDD) minus the ground voltage (GND), to the bit cell capacitors Ci and Cα of all the bit cells (BCell), the switch CA-SW1 and the switch CA-SW2 are set to ON, on the basis of the control signal (CSi, CSα).

(B) Second Timing

At the second timing after the first timing, the switch NP-SHSW and the switch RP-SHSW are set to OFF, on the basis of the control signal (CSSH), and the switch CA-SW1 and the switch CA-SW2 of the dither signal bit cell BCα are set to OFF, on the basis of the control signal (CSα). Then, the switch NP-CSSW and the switch RP-CSSW are set to ON, on the basis of the control signal (CSSH), and the switch SW4a and the switch SW4b of the dither signal bit cell BCα are set to ON, on the basis of the control signal (CSα). By the present on/off control, one end of the dither signal capacitor Cα and one end of the capacitor NP-SHC are coupled to the node NPCS-N. The other end of the dither signal capacitor Cα and the one end of the capacitor RP-SHC are coupled to the node RPCS-N. According to the established coupling, a charge in the dither signal capacitor Cα and a charge in the capacitor NP-SHC are shared and distributed to the node NPCS-N. The charge in the dither signal capacitor Cα and the charge in the capacitor RP-SHC are shared and distributed to the node RPCS-N. A voltage of the node NPCS-N to which the charge is distributed and a voltage of the node RPCS-N to which the charge is distributed are compared by the comparator CS-CMP. The comparator CS-CMP outputs 1 when a comparison result is positive, for example, and outputs 0 when the comparison result is negative, for example. On the basis of the present comparison result, the control circuit 221A determines the (N−1)th digital output signal (DN−1) as the maximum bit.

(C) Third Timing

At the third timing after the second timing, the switch of the bit cell for the most significant bit BCN−1 is controlled, on the basis of a control signal (CSN−1) and the digital output signal (DN−1). When DN−1 is 1, the switches SW5a and SW5b are set to ON. Accordingly, a charge amount in the bit cell capacitor CN−1 of the bit cell for the most significant bit BCN−1 is subtracted from a charge amount of the node NPCS-N. Furthermore, the charge amount in the bit cell capacitor CN−1 of the bit cell for the most significant bit BCN−1 is subtracted from a charge amount of the node RPCS-N. When DN−1 is 0, the switches SW4a and SW4b are set to ON. Accordingly, the charge amount in the bit cell capacitor CN−1 of the bit cell for the most significant bit BCN−1 is added to the node NPCS-N. Furthermore, the charge amount in the bit cell capacitor CN−1 of the bit cell for the most significant bit BCN−1 is added to the node RPCS-N. Accordingly, charge distribution takes place in the node NPCS-N, and charge distribution takes place in the node RPCS-N. The voltage of the node NPCS-N to which the charge is distributed and the voltage of the node RPCS-N to which the charge is distributed are compared by the comparator CS-CMP. The comparator CS-CMP outputs 1 when a comparison result is positive and outputs 0 when the comparison result is negative, for example. On the basis of the present comparison result, the control circuit 22 determines the (N−2)th digital output signal (DN−2).

The operation as described above is repeated in the following and the control circuit 22 determines up to the digital output signal (D0).

When the dither voltage to be applied needs to be inverted (when the second dither signal (Dither2) is applied), what is necessary is just to set to ON the switch SW5a and the switch SW5b, in lieu of the switch SW4a and the switch SW4b of the dither signal bit cell BCα at the second timing.

(b) A/D Conversion Actual Operation

The operation at the time of the actual A/D conversion operation is basically the same as that at the time of the A/D conversion test operation. However, since the dither signal bit cell BCα is not used, the switch CA-SW2 and the switch DC-SW3 of the dither signal bit cell BCα are kept "ON".

According to the operation described above, the A/D conversion operation is performed by superimposing the dither signal component at the time of the A/D conversion test operation, and performed without the dither signal component at the time of the actual A/D conversion operation.

(3) Summary

Since the successive approximation register A/D conversion unit is employed, the operation at 50 MS/s or less and with low power consumption of several milliwatts or less is possible. Access frequency to a reference voltage is so low that the access is required only once for outputting once the first A/D conversion result (D1R) or the second A/D conversion result (D2R); therefore, it is possible to simplify the generation of the reference voltage, as an advantage. Furthermore, it is possible to reduce the power consumption of a regulator which generates the reference voltage, and it is also possible to accomplish the design of the regulator with relative ease. The reference voltage described here is the voltage for charging a charge corresponding to the voltage of the power supply voltage (VDD) minus the ground voltage (GND), to the bit cell capacitor Ci of all the bit cells BCell. The charge sharing type A/D conversion unit is an A/D conversion unit which performs an A/D conversion operation, by sharing (distributing) the charge stored in the capacitor NP-SHC or the capacitor RP-SHC as a capacitor to which an analog signal is sampled, among the dither signal capacitor Cα or the bit cell capacitor Ci and the capacitor NP-SHC or the capacitor RP-SHC as a capacitor to which an analog signal is sampled.

5. Buffer Unit

Figure 12:
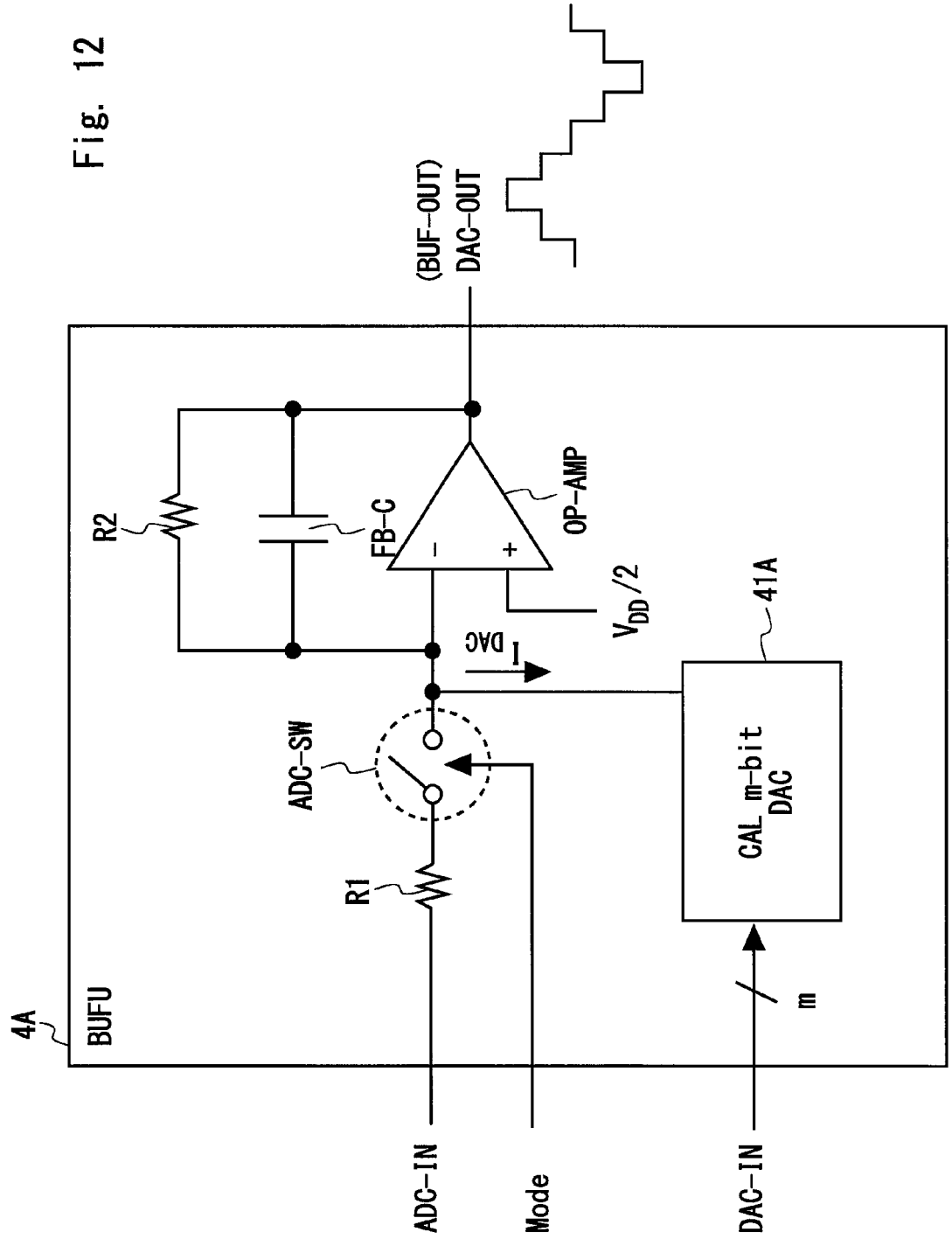
FIG. 12 illustrates a configuration of the buffer unit.

FIG. 12 illustrates a configuration of the buffer unit. The buffer unit 4A has a resistor R1, a switch ADC-SW, a resistor R2, a capacitor FB-C, an operational amplifier OP-AMP, and a D/A conversion circuit (CAL m-bit DAC) 41A. Here, the buffer unit may be called a holding unit or a holding circuit.

An input signal (ADC-in) is inputted into one end of the resistor R1, and the other end of the resistor R1 is coupled to one end of the switch ADC-SW. The other end of the switch ADC-SW is coupled to an inverting input terminal (−) of the operational amplifier OP-AMP. One end of the resistor R2 is coupled to the inverting input terminal (−) of the operational amplifier OP-AMP, and the other end of the resistor R2 is coupled to an output terminal of the operational amplifier OP-AMP. The capacitor FB-C is coupled to the resistor R2 in parallel. A power supply voltage (VDD/2) which is one half of the power supply voltage (VDD) is inputted into a noninverting input terminal (+) of the operational amplifier OP-AMP. By a digital input signal (DAC-IN) of m bits (m is a natural number of 2 or greater) inputted into the D/A conversion circuit 41A, a current (IDAC) flows from the output terminal of an operational amplifier 51, passing through the resistor R2 and the inverting input terminal (−) of the operational amplifier OP-AMP and reaching the D/A conversion circuit 41A. A D/A converter is configured with the D/A conversion circuit 41A, the operational amplifier OP-AMP, the resistor R2, and the capacitor FB-C. In addition, an input buffer circuit is configured with the resistor R1, the resistor R2, the capacitor FB-C, and the operational amplifier OP-AMP.

At the time of the A/D conversion test operation, the switch ADC-SW is set to OFF by the mode signal (Mode) outputted from the mode register 5A in response to setting of the A/D conversion correction mode (CM). By the digital input signal (DAC-IN) of m bits (m is a natural number) inputted into the D/A conversion circuit 41A, the current (IDAC) corresponding to a setting value of the m bits flows. The current (IDAC) concerned generates an output signal (DAC-OUT) at the other end of the resistor R2. The output signal (DAC-OUT) is generated by the digital input signal (DAC-IN) of m bits (m is the natural number); therefore, the output signal (DAC-OUT) has values various enough to determine the correction coefficient (CC), although accuracy thereof is low. In addition, the current (IDAC) is determined by an amount of a current which flows into plural current sources corresponding to the m bits. This is because the D/A conversion circuit 41A is configured such that whether the current flows into each current source is determined by the value of the m bits through a switch control, and accordingly, the current (IDAC) proportional to the value of the m bits flows. Consequently, the current (IDAC) becomes constant during two conversion cycles (2/fs), and the output signal (DAC-OUT) also becomes constant during two conversion cycles (2/fs). Consequently, the buffer unit 4A holds the output signal (DAC-OUT) with a high degree of accuracy during two conversion cycles (2/fs). In this way, the buffer unit 4A holds the output signal (DAC-OUT) during two conversion cycles (2/fs) and hence the output signal (DAC-OUT) sampled in the first A/D conversion period (A/D1) and the output signal (DAC-OUT) sampled in the second A/D conversion period (A/D2) have the same voltage. Therefore, it is possible to use the charge sharing type A/D conversion unit 2A as the A/D conversion unit. This is because the charge sharing type A/D conversion unit destroys the input voltage sampled at the time of A/D converting and it is necessary to hold the output signal (DAC-OUT). In order to generate the output signal (DAC-OUT) with a full variety of values, the digital input signal (DAC-IN) of m bits is changed for every two conversion cycles (2/fs), and the current (IDAC) corresponding to the changed setting value of the m bits flows to generate the output signal (DAC-OUT).

At the time of the actual A/D conversion operation, the switch ADC-SW is set to ON by the mode signal (Mode) outputted from the mode register 5A in response to setting of the actual A/D conversion operation mode (RM). The output signal (BUF-OUT) is outputted in response to the input signal (ADC-in) inputted. Gain of the output signal (BUF-OUT) to the input signal (ADC-in) is given by a negative ratio of a value of resistance of the resistor R2 to a value of resistance of the resistor R1. The capacitor FB-C serves as noise resistance. At the time of the actual A/D conversion operation, the digital input signal (DAC-IN) of m bits is set so that the current (IDAC) may be set to 0.

In this way, the buffer unit 4A generates the output signal (DAC-OUT) for calculating the correction coefficient (CC) by performing the D/A converting at the time of the A/D conversion test operation, and generates the output signal (BUF-OUT) by converting the input signal (ADC-in) with a scale factor of the gain described above at the time of the actual A/D conversion operation. Consequently, the buffer unit 4A has both a generation function of the output signal (DAC-OUT) as the test signal for calculating the correction coefficient (CC), and a generation function of the output signal (BUF-OUT) on the basis of the input signal (ADC-in). In addition, the input buffer circuit and the D/A converter share the operational amplifier OP-AMP, the resistor R2, and the capacitor FB-C; accordingly, an area overhead decreases.

In summary, the semiconductor integrated circuit device 10A has the A/D conversion unit 2A, the digital correction unit 3A, and the buffer unit 4A. At the first A/D conversion period (A/D1) in the A/D conversion test operation, the A/D conversion unit 2A outputs the first A/D conversion result (D1R) as a digital signal, by A/D converting the dither signal (Dither1) and the output signal (DAC-OUT). Furthermore, at the subsequent second A/D conversion period (A/D2), the A/D conversion unit 2A outputs the second A/D conversion result (D2R) as a digital signal, by A/D converting the output signal (DAC-OUT). The correction coefficient (CC) for the A/D conversion is determined on the basis of the digital output (DC1R) obtained by digital correction performed to the first A/D conversion result (D1R) and the digital output (DC2R) obtained by digital correction performed to the second A/D conversion result (D2R). The output signal (DAC-OUT) is held by the buffer unit 4A during the first A/D conversion period (A/D1) and the second A/D conversion period (A/D1) in the A/D conversion test operation.

In this way, the buffer unit holds the output signal (DAC-OUT) during the first A/D conversion period (A/D1) and the second A/D conversion period (A/D2) in the A/D conversion test operation. Consequently, the charge sharing type A/D conversion unit can be used as the A/D conversion unit. The access frequency to the reference voltage is low; therefore, it is possible to simplify the generation of the reference voltage as an advantage. Furthermore, it is possible to reduce the power consumption of the regulator which generates the reference voltage, and it is also possible to accomplish the design of the regulator with relative ease. Furthermore, only one A/D conversion unit 2A as an analog circuit is required; accordingly, it is possible to suppress the increase of an area.

In addition, the buffer unit 4A has both a generation function of the output signal (DAC-OUT) as the test signal for calculating the correction coefficient (CC), and a generation function of the output signal (BUF-OUT) on the basis of the input signal (ADC-in). Consequently, it is not necessary to provide separately a circuit for generating the output signal (DAC-OUT) as the test signal for calculating the correction coefficient (CC), and a circuit for generating the output signal (BUF-OUT) on the basis of the input signal (ADC-in); therefore, it is possible to reduce the area.

Furthermore, owing to the dither signal (Dither), in the A/D conversion correction mode (CM), the correction coefficient (CC) for digital correction of the first A/D conversion result (D1R) and the correction coefficient (CC) for digital correction of the second A/D conversion result (D2R) have different higher-order bits. Consequently, it is possible to search the correction coefficient (CC), speedily and surely.

(Problem Found by Inventors)

However, the inventors found that there is a problem shown hereinafter in the above-described semiconductor integrated circuit device. This problem is explained hereinafter.

In the above-described foreground digital calibration, it is necessary to prepare as an input test signal a signal obtained by adding the dither signal whose value is alternately replaced to a signal held during two conversion cycles. In view of ease of implementation of the semiconductor device or superiority in accuracy and area thereof, it is convenient for the dither signal to be added in the sample hold circuit, and to be used also as an input buffer which uses a driver unit of a hold signal generating circuit in regular A/D conversion.

It is not necessary for this test hold signal to be absolutely accurate, and the test hold signal may have a diversity just large enough to determine a weighting coefficient of an AD output bit. For example, in a case of 13 bitADC, the hold signal may have just about 100 levels. However, a voltage difference during a hold period becomes an error of a weighting coefficient value, which directly leads to a deterioration in the accuracy of an A/D conversion result. For this reason, a voltage value during two conversion cycles must be held accurately, and low noise is required. In addition, when the test signal (the hold signal+the dither signal) exceeds a full scale input of the ADC, there is a possibility that a coefficient calculation may cause a large error.

In order to satisfy the above requirement, in the semiconductor integrated circuit device, a highly accurate (current) DAC and the driver circuit are configured by being combined with each other, and there is thus a possibility of causing an increase in the area and current of the semiconductor current. Particularly, as illustrated in FIG. 12, the DAC 41A having plural bits is needed for the buffer unit 4A, and there is a possibility of causing the increase in the area and current. In addition, in order to prevent overrange of the full scale input, it is necessary to design the semiconductor integrated circuit device carefully by providing an overrange detection circuit, etc.

Embodiment 1

A semiconductor device according to the embodiment is provided for solving the above-described problem. Hereinafter, the semiconductor device according to the embodiment 1 is explained with reference to the drawings.

(Buffer Unit 4C)

Figure 13:
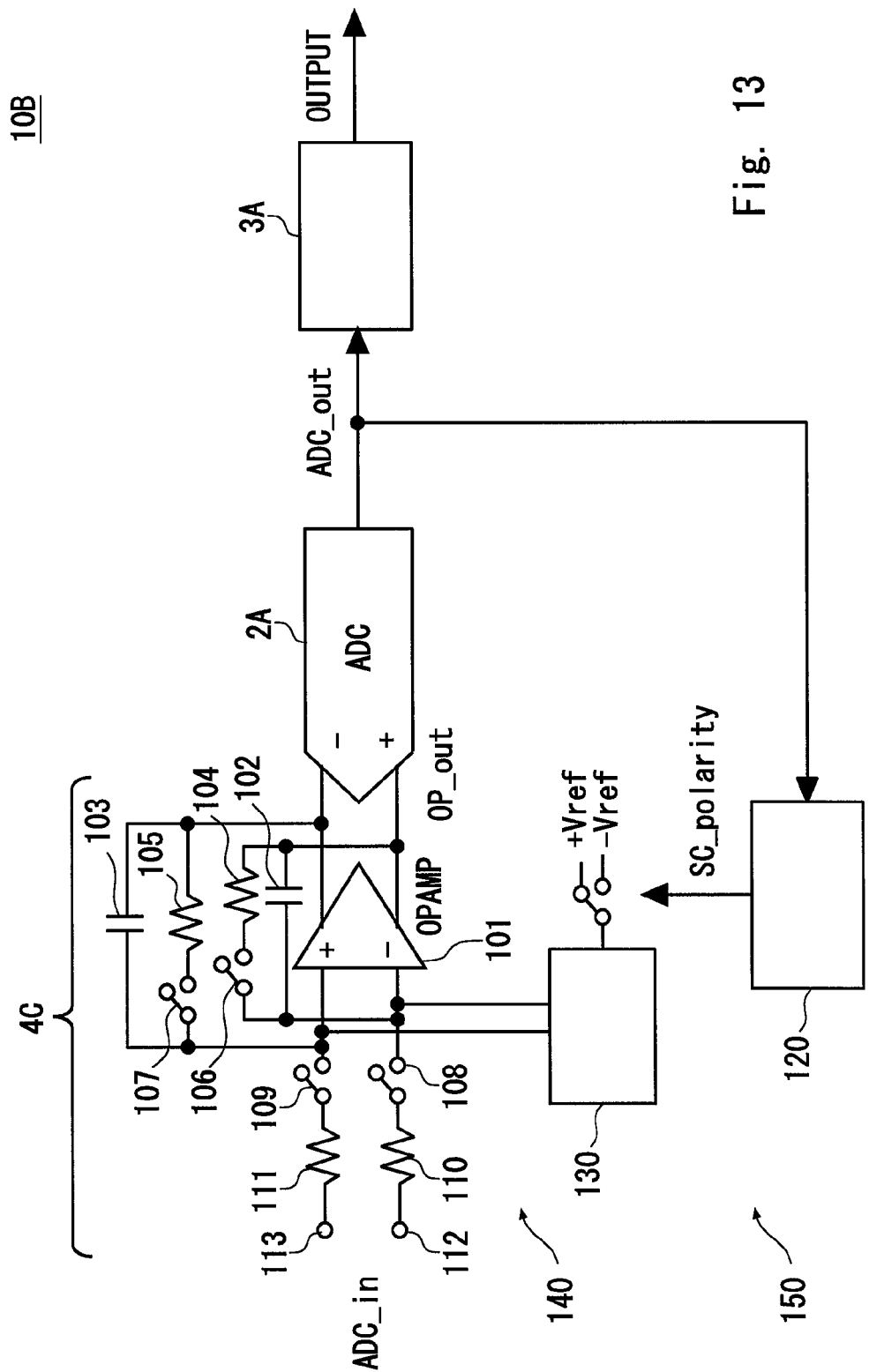
FIG. 13 is a circuit diagram illustrating a buffer unit of a semiconductor integrated circuit device according to the first embodiment.

FIG. 13 is a circuit diagram illustrating a main portion of a semiconductor integrated circuit device 10B according to the embodiment 1. The semiconductor integrated circuit device 10B includes a buffer unit 4C, the A/D conversion unit 2A, and the digital correction unit 3A. Since the A/D conversion unit 2A and the digital correction unit 3A correspond to the configurations illustrated in FIGS. 1 to 11, they are illustrated in a simplified manner. Since the A/D conversion unit 2A and the digital correction unit 3A are similar to ones explained above, explanations thereof are appropriately omitted. For example, although the dither signal is inputted into the A/D conversion unit 2A, it is omitted in FIG. 13. Here, it is shown that the A/D conversion unit 2A treats a differential signal.

Hereinafter, an explanation centering on a circuit of the buffer unit 4C will be given. The buffer unit 4C is a circuit which has a hold period of not less than two cycles of the A/D conversion unit 2A. The buffer unit 4C is provided at an input side of the A/D conversion unit 2A. The buffer unit 4C includes an input buffer circuit 140 and a hold signal generating circuit 150.

The input buffer circuit 140 includes an input buffer 101, feedback capacitors 102 and 103, feedback resistors 104 and 105, selector switches 106 and 107, input switches 108 and 109, input resistors 110 and 111, an input terminal 112, and an input terminal 113. The input buffer circuit 140 has a function to receive an input signal ADC_in inputted into the A/D converter 1A.

The hold signal generating circuit 150 includes the input buffer 101, the feedback capacitors 102 and 103, a sampling circuit 130, and a logic circuit 120. The input buffer circuit 140 and the hold signal generating circuit 150 share the input buffer 101 and the feedback capacitors 102 and 103. The hold signal generating circuit 150 generates a hold signal for performing digital calibration. The hold signal is an input test signal held for a period twice as long as an A/D conversion cycle of the A/D conversion unit 2A as described above.

The input signal ADC_in is inputted into the input terminals 112 and 113. The input terminal 112 is coupled to the input buffer 101 through the input resistor 110 and the input switch 108. Similarly, the input terminal 113 is coupled to the input buffer 101 through the input resistor 111 and the input switch 109. The input switches 108 and 109 switch opening and closing at the time of an actual A/D conversion operation and an A/D conversion test operation. The input switches 108 and 109 are, for example, opened and closed according to a mode signal (Mode) from the mode register 5A. Additionally, the input switches 108 and 109 are arranged between the input buffer 101 and the input terminals 112 and 113, and cause the input buffer 101 to be uncoupled from the input terminals 112 and 113. At the time of the actual A/D conversion operation, the input switches 108 and 109 are closed, and the input signal ADC_in is inputted into the input buffer 101. At the time of the A/D conversion test operation (calibration), the input switches 108 and 109 are opened, and the input buffer 101 is separated from the input terminals 112 and 113, to thereby be uncoupled therefrom. Here, the differential input signal ADC_in is inputted into the input buffer 101. Consequently, the input buffer 101 has two input terminals and two output terminals, respectively.

The input buffer 101 corresponds to the operational amplifier OP-AMP illustrated in FIG. 12. The feedback resistor 104 and the selector switch 106 are coupled in series between one input and output of the input buffer 101. The feedback capacitor 102 is coupled to the feedback resistor 104 in parallel between the one input and output of the input buffer 101. Similarly, the feedback resistor 105 and the selector switch 107 are coupled in series between the other input and output of the input buffer 101. The feedback capacitor 103 is coupled to the feedback resistor 105 in parallel between the other input and output of the input buffer 101.

Opening and closing of the selector switches 106 and 107 are switched at the time of the actual A/D conversion operation and the A/D conversion test operation. The selector switches 106 and 107 are, for example, opened and closed according to the mode signal (Mode) from the mode register 5A as illustrated in FIG. 6. At the time of the actual A/D conversion operation, the selector switches 106 and 107 are closed, and the feedback resistors 104 and 105 are coupled to the input of the input buffer 101. As a result of this, the input buffer 101 functions as a buffer of resistor feedback. At the time of the actual A/D conversion operation, the feedback capacitors 102 and 103 function as noise reduction filters.

At the time of the A/D conversion test operation (calibration), the selector switches 106 and 107 are opened. The feedback resistors 104 and 105 are uncoupled from the input of the input buffer 101. Additionally, the feedback capacitors 102 and 103 operate as an SC (Switched Capacitor) integrator together with the sampling circuit 130 coupled to a virtual ground node. At the time of the A/D conversion test operation, the feedback capacitors 102 and 103 function as an integral capacity of the SC integrator. The SC integrator operates at the time of the A/D conversion test operation. Operation of the SC integrator is described later. As described later, since a kT/C noise at the time of a hold operation does not cause a problem, there is almost no new restriction due to using the capacity for two purposes. That is, it becomes possible to use the feedback capacitors 102 and 103 for the actual A/D conversion operation and the A/D conversion test operation. With this configuration, the only major noise source of the hold signal generating circuit 150 is the input buffer 101. Consequently, compared with the configuration having the DAC of the plural bits, high accuracy can be realized by this configuration.

The sampling circuit 130 has the switches and the capacitors which are included in the above-described SC integrator. The logic circuit 120 monitors an output signal ADC_out of the A/D conversion unit 2A. The logic circuit 120 then outputs a control signal SC_polarity which controls the sampling circuit 130 on the basis of a monitoring result. For example, the control signal SC_polarity from the logic circuit 120 switches a reference voltage Vref supplied to the sampling circuit 130. That is, +Vref or −Vref is switched according to the output of the A/D conversion unit 2A, and is supplied to the sampling circuit 130.

At the time of the A/D conversion test operation, the hold signal generating circuit 150 outputs an output signal OP_out of the input buffer 101 to the A/D conversion unit 2A as the hold signal. The output signal OP_out of the input buffer 101 corresponds to the DAC_OUT illustrated in FIGS. 4 and 12. The hold signal has a hold period of two cycles of the A/D conversion unit 2A. For example, the hold signal is a signal whose value changes for every two conversion cycles (2/fs) of the A/D conversion unit 2A. In other words, the same value is held for two conversion cycles (2/fs). The A/D conversion unit 2A performs A/D converting twice to the output signal (DAC-OUT) having the same value. fs is an A/D conversion frequency of the A/D conversion unit 2A, i.e., a sampling frequency.

For example, when sampling voltage polarity of the SC integrator is positive, a value of the hold signal increases by a fixed amount for every two conversion cycles (2/fs). When the sampling voltage polarity of the SC integrator is negative, the value of the hold signal decreases by a fixed amount for every two conversion cycles (2/fs). More specifically, the logic circuit 120 compares the output of the A/D conversion unit 2A with a threshold value. The logic circuit 120 outputs the control signal SC_polarity according to a comparison result to the sampling circuit 130. The control signal SC_polarity is a signal which indicates the sampling voltage polarity of the SC integrator, and is, for example, a 1-bit digital signal. When the control signal SC_polarity is 1, the sampling voltage polarity is positive, and when the control signal SC_polarity is 0, the sampling voltage polarity is negative.

The logic circuit 120 detects that the output signal ADC_out of the A/D conversion unit 2A exceeds a first threshold value Vth_h (for example, higher-order M bits of the ADC_out are "1"), and that the output signal ADC_out of the A/D conversion unit 2A is below a second threshold value (Vth_l) (for example, the higher-order M bits of the ADC_out are "0"). It is assumed that Vth_h>Vth_l, and that M is a natural number. The logic circuit 120 detects whether the output signal ADC_out of the A/D conversion unit 2A falls within a range prescribed by the first threshold value Vth_h and the second threshold value Vth_l, or is outside of the range. Accordingly, when the output signal ADC_out of the A/D conversion unit 2A is outside of the range from Vth_l to Vth_h, it turns out that the output signal ADC_out has reached the vicinity of a full scale of the A/D conversion unit 2A. The logic circuit 120 then compares the output signal ADC_out with the first threshold value Vth_h and the second threshold value Vth_l, and outputs the control signal SC_polarity which controls polarity of the SC integrator according to a comparison result.

When a value of the output signal ADC_out of the A/D conversion unit 2A exceeds the first threshold value Vth_h, the logic circuit 120 sets the control signal SC_polarity as a first value. As a result of this, the sampling voltage polarity of the SC integrator becomes negative, and the hold signal is decremented. When the value of the output signal ADC_out is below the second threshold value Vth_l, the logic circuit 120 sets the control signal SC_polarity as a second value. As a result of this, the sampling voltage polarity of the SC integrator becomes positive, and the hold signal is incremented. When the value of the output signal ADC_out falls within the range prescribed by the first threshold value Vth_h and the second threshold value, the logic circuit 120 does not change the value of the control signal SC_polarity, and maintains it as it is. As a result of this, the sampling voltage polarity of the SC integrator is maintained as it is. For example, when it is determined that the value of the output signal ADC_out falls between the first threshold value Vth_h and the second threshold value Vth_l at the time of the sampling voltage polarity of the SC integrator being negative, the sampling voltage polarity remains negative. When it is determined that the value of the output signal ADC_out falls between the first threshold value Vth_h and the second threshold value Vth_l at the time of the sampling voltage polarity of the SC integrator being positive, the sampling voltage polarity remains positive.

The hold signal generating circuit 150 has a feedback configuration which can generate a hold signal having a triangular waveform. The hold signal repeats increasing to the first threshold value Vth_h and decreasing to the second threshold value Vth_l without exceeding the full scale of the A/D conversion unit 2A. Since the above-described function can be realized in a simple logic circuit, a problem of overrange can be solved almost without circuit overhead. In this way, the logic circuit 120 functions as a Schmitt trigger circuit, and a threshold value changes whenever it is exceeded. As a result of this, the polarity of the SC integrator can be simply controlled. The values of the first threshold value Vth_h and the second threshold value Vth_l may be set just on the basis of a value of the dither signal component a. That is, OP_out+α and OP_out−α may just be set so as not to exceed the input full scale of the A/D conversion unit 2A.

(SC Integrator)

Figure 14:
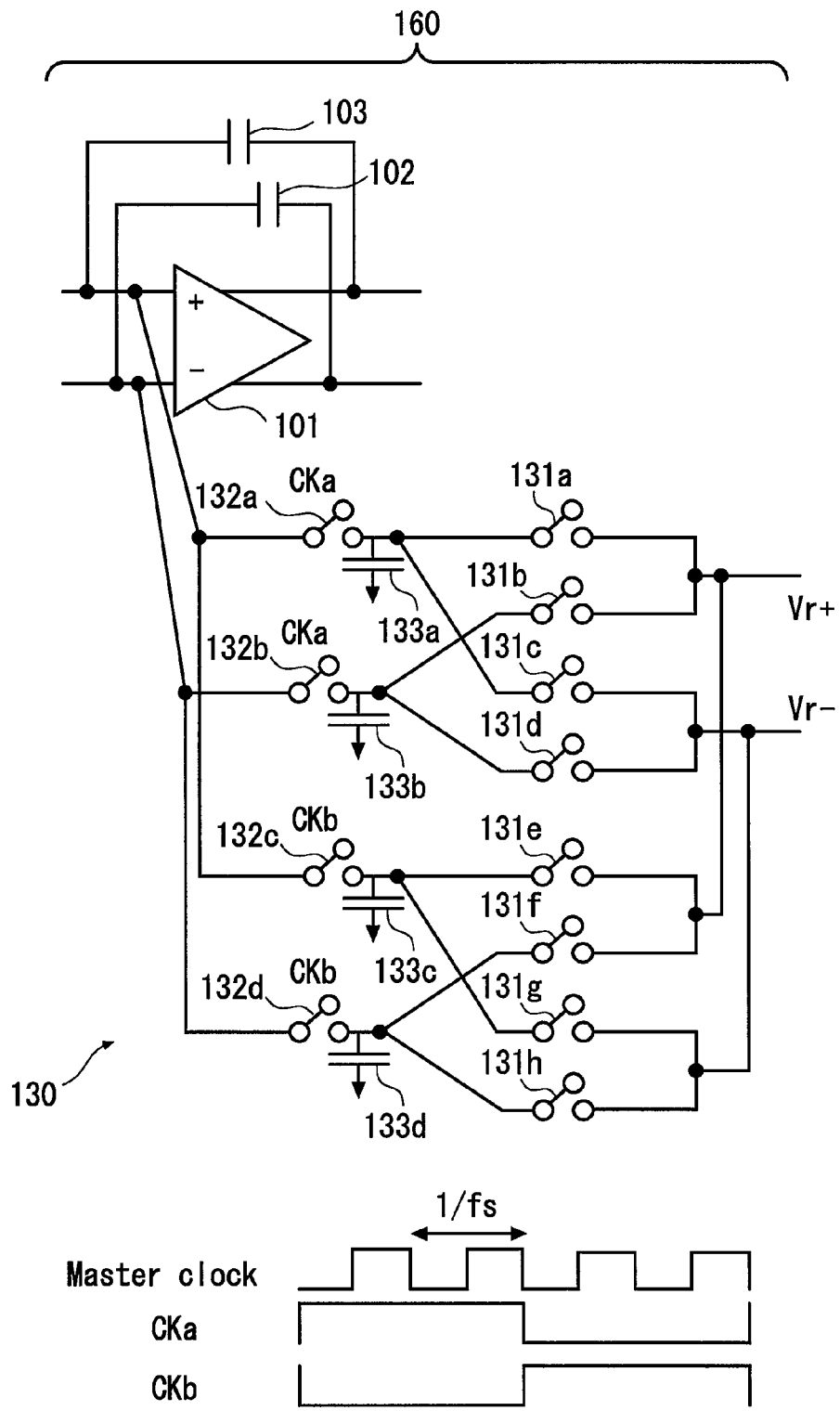
FIG. 14 is a circuit diagram illustrating a main portion of the semiconductor integrated circuit device according to the first embodiment.

Next, a configuration of the SC integrator using the sampling circuit 130 is explained using FIG. 14. FIG. 14 is a circuit diagram schematically illustrating an SC integrator 160. At the time of the A/D conversion test operation, the selector switch 106, the selector switch 107, and the input switches 108 and 109 which are illustrated in FIG. 13 are opened. Consequently, in FIG. 14, the selector switches 106 and 107, the input switches 108 and 109, the feedback resistors 104 and 105, the input resistors 110 and 111, etc. are omitted.

As illustrated in FIG. 14, the sampling circuit 130, the input buffer 101, and the feedback capacitors 102 and 103 are included in the SC integrator 160. The sampling circuit 130 includes eight first switches 131, four capacitors 133, and four second switches 132. In order to identify the eight first switches 131, they are illustrated as switches 131a to 131h in FIG. 14. Similarly, in order to identify the four capacitors 133 and the four second switches 132, they are illustrated as capacitors 133a to 133d and switches 132a to 132d in FIG. 14.

A positive voltage +Vr is supplied to one end of each of the first switches 131a, 131b, 131e, and 131f, respectively. A negative voltage −Vr is supplied to one end of each of the first switches 131c, 131d, 131g, and 131h, respectively. The other respective ends of the first switches 131a and 131c are coupled to the capacitor 133a. The other respective ends of the first switches 131b and 131d are coupled to the capacitor 133b. The other respective ends of the first switches 131e and 131g are coupled to the capacitor 133c. The other respective ends of the first switches 131f and 131h are coupled to the capacitor 133d.

One end of the second switch 132a is coupled to the capacitor 133a, the other end of the first switch 131a, and the other end of the first switch 131c. One end of the second switch 132b is coupled to the capacitor 133b, the other end of the first switch 131b, and the other end of the first switch 131d. One end of the second switch 132c is coupled to the capacitor 133c, the other end of the first switch 131e, and the other end of the first switch 131g. One end of the second switch 132d is coupled to the capacitor 133d, the other end of the first switch 131f, and the other end of the first switch 131h.

The other respective ends of the second switch 132a and the second switch 132c are coupled to a noninverting input terminal (+) of the input buffer 101 and one end of the feedback capacitor 102. The other respective ends of the second switch 132b and the second switch 132d are coupled to an inverting input terminal (−) of the input buffer 101 and one end of the feedback capacitor 103. In this way, the SC integrator 160 includes switched capacitor circuits of four systems.

The second switch 132a and the second switch 132b operate on the basis of a clock signal Cka. The second switch 132c and the second switch 132d operate on the basis of a clock signal Ckb. The clock signals CKa and Ckb are illustrated in a lower part of the FIG. 14. The clock signals Cka and Ckb are clock signals which become an H level by two cycles of a master clock. The master clock is a clock signal which serves as a sampling frequency fs of the A/D conversion unit 2A. Additionally, the clock signal Cka and the clock signal Ckb have phases deviated from each other by 180°. That is, when the clock signal Cka is at the H level, the clock signal Ckb becomes an L level, and when the clock signal Cka is at the L level, the clock signal Ckb becomes the H level.

Accordingly, the second switches 132a and 132b are opened alternately with the second switches 132c and 132d. That is, in a period when the clock signal Cka is at the H level, the second switch 132a and the second switch 132b are closed, and the second switch 132c and the second switch 132d are opened. In addition, in a period when the clock signal Ckb is at the H level, the second switch 132c and the second switch 132d are closed, and the second switch 132a and the second switch 132b are opened.

The first switch 131a and the first switch 131d operate on the basis of the clock signal Cka, when the control signal SC_polarity is 1. That is, the first switch 131a and the first switch 131d are closed, when the control signal SC_polarity is 1, and the clock signal Cka is at the H level. The first switch 131a and the first switch 131d are opened, when the control signal SC_polarity is 0, or the clock signal Cka is at the L level.

The first switch 131b and the first switch 131c operate on the basis of the clock signal Cka, when the control signal SC_polarity is 0. That is, the first switch 131b and the first switch 131c are closed, when the control signal SC_polarity is 0, and the clock signal Cka is at the H level. The first switch 131b and the first switch 131c are opened, when the control signal SC_polarity is 1, or the clock signal Cka is at the L level.

The first switch 131e and the first switch 131h operate on the basis of the clock signal Ckb, when the control signal SC_polarity is 1. That is, the first switch 131e and the first switch 131h are closed, when the control signal SC_polarity is 1, and the clock signal Ckb is at the H level. The first switch 131e and the first switch 131h are opened, when the control signal SC_polarity is 0, or the clock signal Ckb is at the L level.

The first switch 131f and the first switch 131g operate on the basis of the clock signal Ckb, when the control signal SC_polarity is 0. That is, the first switch 131f and the first switch 131g are closed, when the control signal SC_polarity is 0, and the clock signal Ckb is at the H level. The first switch 131f and the first switch 131g are opened, when the control signal SC_polarity is 1, or the clock signal Ckb is at the L level.

Hereinafter, an operation when the SC_polarity is 1 is explained. When the SC_polarity is 1, the first switches 131b, 131c, 131f, and 131g remain opened. When the SC_polarity is 1, the first switch 131a and the second switch 132a which have been coupled to the capacitor 133a are alternately opened and closed. As a result of this, the switched capacitor circuit is configured. Similarly, when the SC_polarity is 1, the first switch 131d and the second switch 132b which have been coupled to the capacitor 133b are alternately opened and closed. As a result of this, the switched capacitor circuit is configured.

At a timing when the clock signal Ckb becomes the H level, the first switch 131a and the first switch 131d are opened, and the second switch 132a and the second switch 132b are closed. As a result of this, the positive voltage +Vr charges the capacitor 133a positive, and the negative voltage −Vr charges the capacitor 133b negative. Additionally, at a timing when the clock signal Cka becomes the H level, the first switch 131a and the first switch 131d are closed, and the second switch 132a and the second switch 132b are opened. As a result of this, a positive charge accumulated in the capacitor 133a charges the feedback capacitor 103. Similarly, a negative charge accumulated in the capacitor 133b charges the feedback capacitor 102.

When the SC_polarity is 1, similarly, the first switch 131e and the second switch 132c which have been coupled to the capacitor 133c are alternately opened and closed. As a result of this, the switched capacitor circuit is configured. Similarly, when the SC_polarity is 1, the first switch 131h and the second switch 132d which have been coupled to the capacitor 133d are alternately opened and closed. As a result of this, the switched capacitor circuit is configured.

At the timing when the clock signal Cka becomes the H level, the first switch 131*e* and the first switch 131*h* are opened, and the second switch 132*c* and the second switch 132*d* are closed. As a result of this, the positive voltage +Vr charges the capacitor 133*c* positive, and the negative voltage −Vr charges the capacitor 133*d* negative. Additionally, at the timing when the clock signal Ckb becomes the H level, the first switch 131*e* and the first switch 131*g* are closed, and the second switch 132*c* and the second switch 132*d* are opened. As a result of this, a positive charge accumulated in the capacitor 133*c* charges the feedback capacitor 103. Similarly, a negative charge accumulated in the capacitor 133*d* charges the feedback capacitor 102.

In this way, when the SC_polarity is 1, the negative charge is supplied to the feedback capacitor 102, and the positive charge is supplied to the feedback capacitor 103. Consequently, the value of the differential hold signal is incremented by a fixed amount. In addition, the clock signals Cka and Ckb are the H level for a period twice as long as an A/D conversion cycle (1/fs). Consequently, the hold signal is incremented for every cycle twice as long as the A/D conversion cycle (1/fs).

Next, an operation when the SC_polarity is 0 is explained. When the control signal SC_polarity is 0, the feedback capacitors 102 and 103 are charged oppositely in positive and negative, opposite to the case where the SC_polarity is 1. For example, when the control signal SC_polarity is 0, the first switches 131*a*, 131*d*, 131*e*, and 131*h* remain opened. Additionally, the first switches 131*b*, 131*c*, 131*f*, and 131*g* are opened and closed. Consequently, the negative voltage −Vr is supplied to the capacitors 131*a* and 131*c*, and the positive voltage +Vr is supplied to the capacitors 131*b* and 131*d*. Additionally, the feedback capacitors 102 and 103 are charged by switched capacitor operation similarly to the above explanation. As a result of this, the positive charge is supplied to the feedback capacitor 102, and the negative charge is supplied to the feedback capacitor 103. According to the control signal SC_polarity, polarity of the charge to charge the feedback capacitors 102 and 103 changes.

The value of the differential hold signal is decremented by the fixed amount. In addition, the clock signals Cka and Ckb are the H level for the period twice as long as the A/D conversion cycle (1/fs), respectively. Consequently, the hold signal is decremented every cycle twice as long as the A/D conversion cycle (1/fs).

In this way, the feedback capacitors 102 and 103 are charged for every cycle twice as long as the A/D conversion cycle (1/fs). The hold signal is the signal which is incremented or decremented in a discrete-time manner for every cycle of 2/fs. In other words, the hold signal is held as the same value by the cycle twice as long as the A/D conversion cycle (1/fs). In this way, the SC integrator 160 is the discrete-time type integrator, and the value of the hold signal changes for every cycle twice as long as the A/D conversion cycle (1/fs). Since the input of the input buffer 101 is set as a differential signal, a differential type SC integrator is employed for the SC integrator 160. However, when a single phase signal is treated, a single-phase SC integrator may be employed for the SC integrator 160. Increase of a circuit area can be prevented by using such a SC integrator. The clock signal Cka may just be a signal having a cycle not less than twice as long as the A/D conversion cycle (1/fs). That is, the first switch 131 and the second switch 132 may just be opened and closed in the cycle not less than twice as long as the A/D conversion cycle (1/fs).

Figure 15:
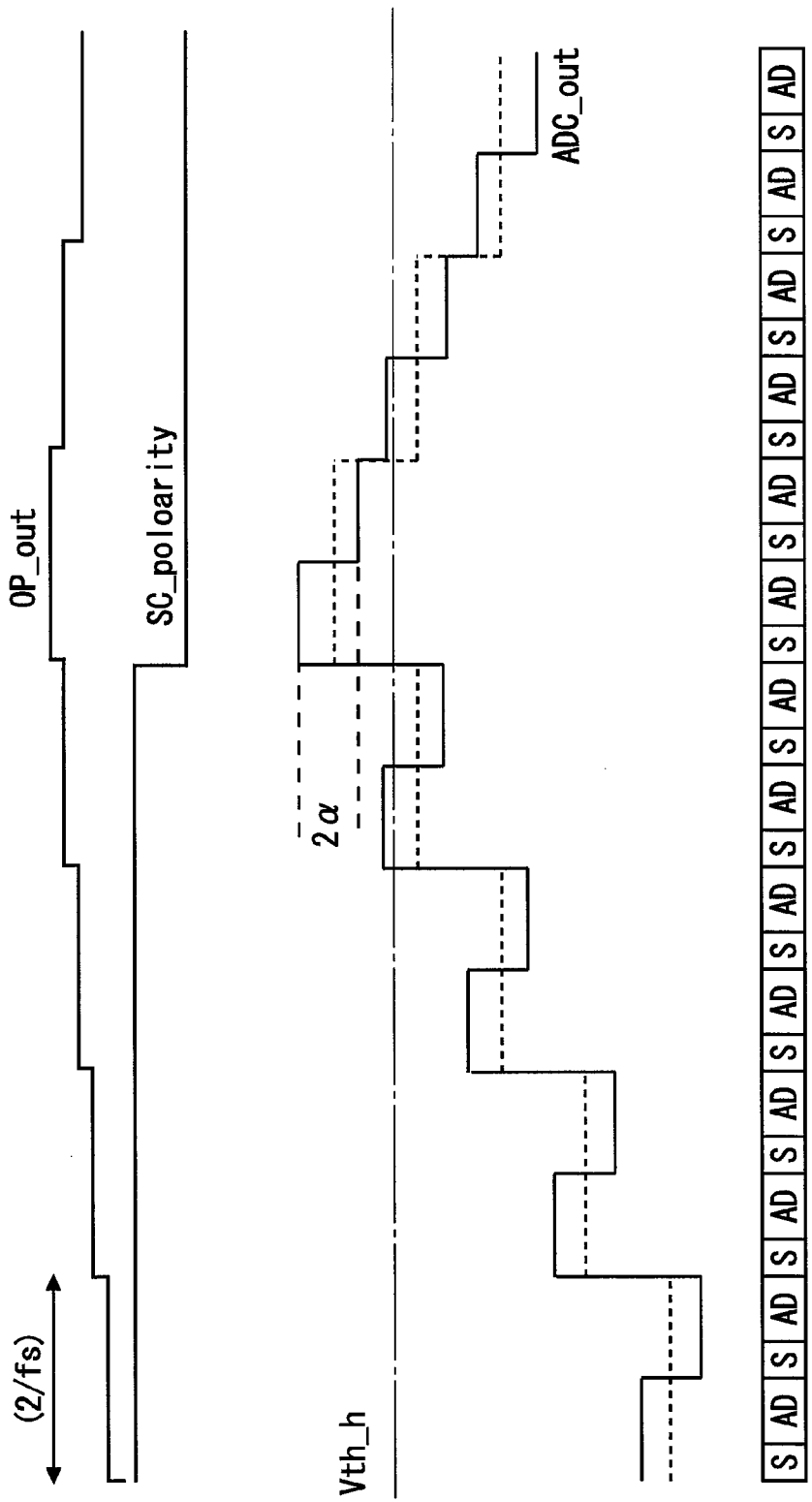
FIG. 15 illustrates a timing flow in an A/D conversion test operation of the semiconductor integrated circuit according to the embodiment.
Figure 16:
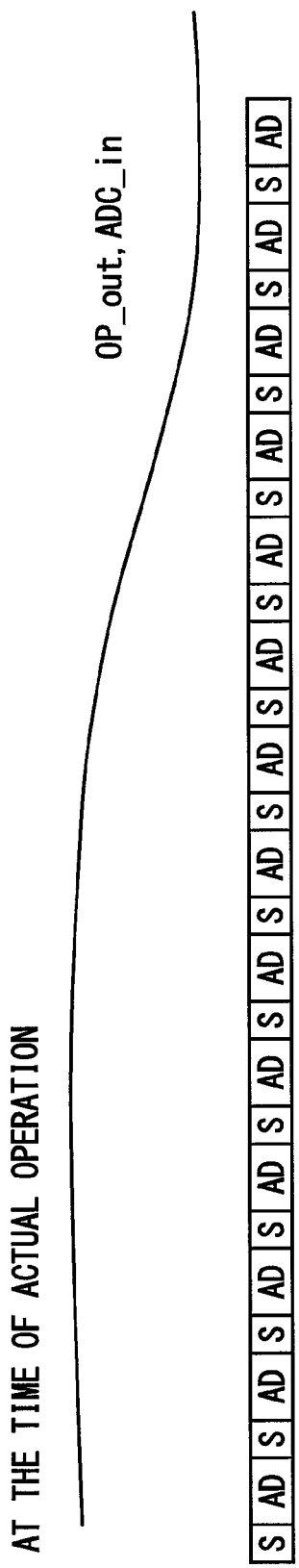
FIG. 16 illustrates a timing flow in an actual A/D conversion operation of the semiconductor integrated circuit according to the embodiment.

Next, a waveform of the hold signal is explained using FIGS. 15 and 16. FIG. 15 illustrates a waveform at the time of the A/D conversion test operation (at the time of a calibration operation), and FIG. 16 illustrates a waveform at the time of the actual A/D conversion operation. In FIGS. 15 and 16, a reference character S denotes a sampling period, and a reference character AD denotes an A/D conversion period. In FIG. 15, there are illustrated the output signal OP_out of the input buffer 101, the control signal SC_polarity, and the output signal ADC_out of the A/D conversion unit 2A. In FIG. 15, the output signal OP_out is superimposed on the output signal ADC_out by dotted lines. The output signal OP_out serves as the hold signal at the time of the A/D conversion test operation. In FIG. 16, the output signal OP_out of the input buffer 101, and the input signal ADC_in of the A/D conversion unit 2A are illustrated.

As illustrated in FIG. 15, when the control signal SC_polarity is 1, a value of the output signal OP_out is incremented by a fixed amount for every cycle twice as long as the A/D conversion cycle (1/fs). The input buffer 101 outputs the output signal OP_out as the hold signal to the A/D conversion unit 2A. In addition to that, the first and the second dither signals are alternately inputted into the A/D conversion unit 2A. Accordingly, the output signal ADC_out of the A/D conversion unit 2A serves as a signal which changes for every one cycle (1/fs). Specifically, the output signal ADC_out of the A/D conversion unit 2A becomes (OP_out+α) in the first A/D conversion period, and becomes (OP_out−α) in the second A/D conversion period. Accordingly, a difference of the output signals ADC_out in the first A/D conversion period and the second A/D conversion period is 2α.

Additionally, the logic circuit 120 compares the output signal ADC_out of the A/D conversion unit 2A with the first threshold value Vth_h. In FIG. 15, the first threshold value Vth_h is illustrated by an alternate long and short dash line. When the value of the output signal ADC_out of the A/D conversion unit 2A exceeds the first threshold value Vth_h, the control signal SC_polarity is inverted through a certain latency. As a result of this, the control signal SC_polarity becomes 0. Furthermore, polarity of increment/decrement of the hold signal is inverted through a certain latency. As a result of this, decrement is performed until the value of the hold signal is below the second threshold value Vth_l.

If the value of the hold signal is below the second threshold value Vth_l, although not illustrated in FIG. 15, the control signal SC_polarity is inverted through a certain latency. As a result of this, the control signal SC_polarity becomes 1. Additionally, the polarity of the increment/decrement of the hold signal is inverted, and increment is performed until the value of the hold signal exceeds the first threshold value Vth_h. This operation is repeated, and thereby the hold signal comes to have a triangular waveform.

At the time of the actual A/D conversion operation, the input signal ADC_in buffered in the input buffer 101 is outputted from the input buffer 101, and the A/D conversion unit 2A performs A/D conversion of the output signal OP_out. Consequently, as illustrated in FIG. 16, the output signal OP_out and input signal ADC_in are the same as each other.

In this way, an error of a hold voltage of two cycles can be reduced by employing a time interleave configuration. The kT/C noise of the SC integrator 160 affects only absolute accuracy of the hold voltage, and does not affect the voltage error during the hold period having strictly required accuracy. For this reason, a capacity used for the SC integrator 160 may be a small size. As a result of this, overhead of area and current of the semiconductor is suppressed to the minimum, and a higher settling speed is realized. According to the configuration of the embodiment, a semiconductor device which conducts highly accurate calibration while using low electric power and having a small area.

The logic circuit 120 compares the value of the output signal ADC_out with the first threshold value Vth_h and the second threshold value Vth_l. Accordingly, the logic circuit 120 serves as a level detection circuit using the output signal ADC_out of the A/D conversion unit 2A. Consequently, the problem of overrange can be solved almost without circuit overhead. Furthermore, since the hold signal generating circuit 150 provided with an interleave switched capacitor integrator which shares the input buffer is used, a request for a semiconductor having a highly accurate voltage hold and a request for semiconductor having low electric power and a small area can be satisfied simultaneously. In addition, in the embodiment, the logic circuit 120 converts the output signal ADC_out of the plural bits into the 1-bit digital signal, and outputs it.

Additionally, the polarity of the SC integrator 160 is inverted on the basis of the 1-bit control signal SC_polarity. Increase of the circuit area and power consumption of the semiconductor device can be suppressed. Although in the above-described explanation, the control signal SC_polarity becomes 0 when the output signal ADC_out outputted from the A/D conversion unit 2A exceeds the first threshold value, and the control signal SC_polarity becomes 1 when the output signal ADC_out outputted from the A/D conversion unit 2A is below the second threshold value, the opposite may be employed. That is, the control signal SC_polarity may become a first value when the output signal ADC_out exceeds the first threshold value, and the control signal SC_polarity may become a second value when the output signal ADC_out is below the second threshold value. Additionally, what is necessary is just to keep the value of the control signal SC_polarity as it is, when the output signal ADC_out falls between the first threshold value and the second threshold value.

The hold signal generating circuit 150 is arranged between the input terminals 112 and 113 and the input buffer 101, and includes an input switch to cause the input terminals 112 and 113 to be uncoupled from the input buffer 101. Additionally, the SC integrator 160 operates in a state where the input terminals 112 and 113 and the input buffer 101 are uncoupled from each other. In other words, the SC integrator 160 does not operate in a state where the input terminals 108 and 109 and the input buffer 101 are coupled to each other. In a manner as described above, the hold signal generating circuit 150 can share the input buffer 101 provided in the sample hold circuit. Consequently, increase of the circuit area of the semiconductor can be suppressed.

Embodiment 2

Figure 17:
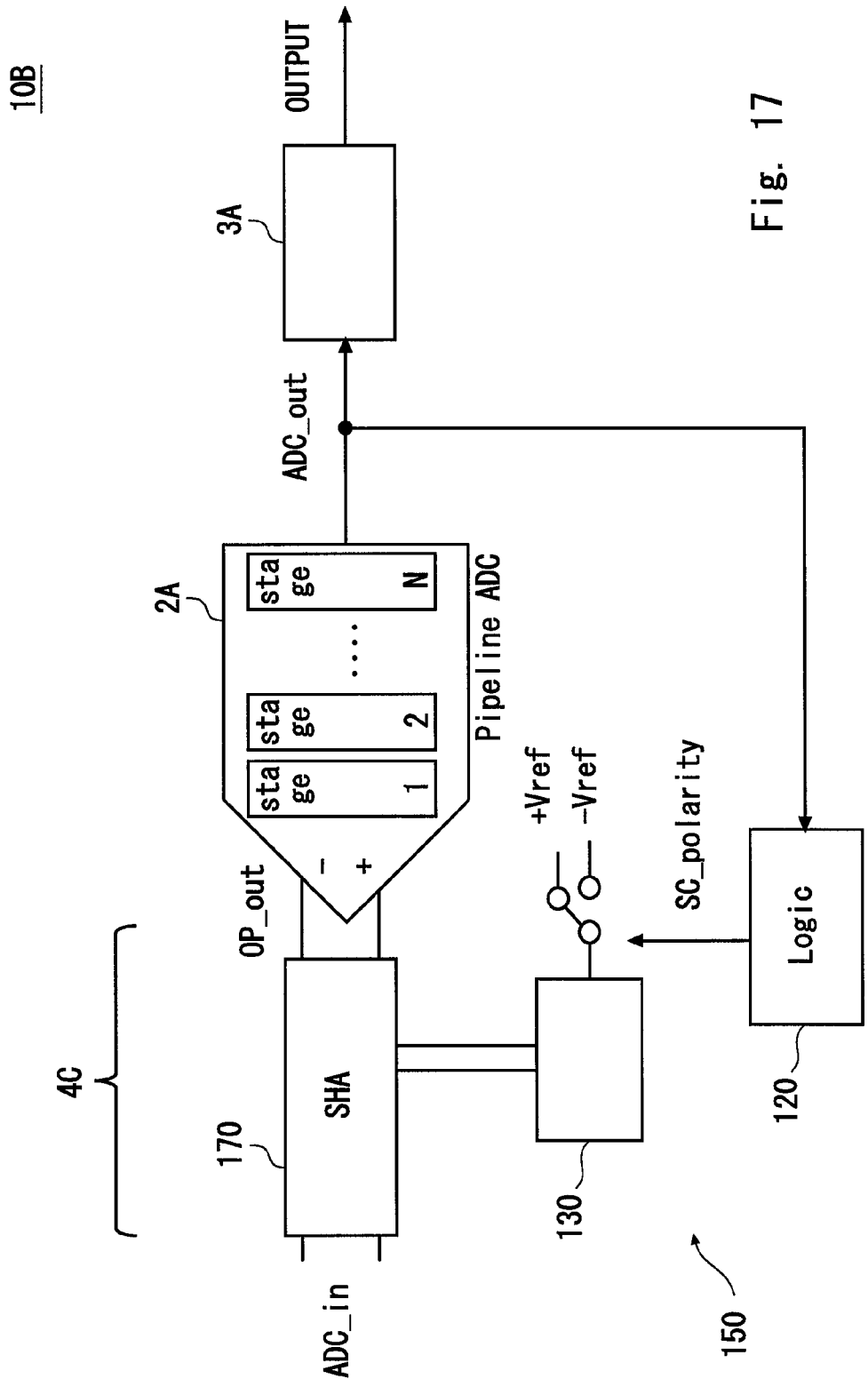
FIG. 17 is a circuit diagram illustrating a main portion of a semiconductor integrated circuit device according to a second embodiment.

In the embodiment, the A/D converter 1 is a pipeline type ADC. A configuration example in which the pipeline type ADC is used as a correction target is illustrated in FIG. 17. FIG. 17 illustrates a circuit configuration of the pipeline type ADC.

The A/D conversion unit 2A is the pipeline type ADC of N stages (a stage 1 to a stage N). Additionally, a sample hold (SHA) circuit 170 is arranged at an input side of the A/D conversion unit 2A. The sample hold circuit 170 processes the input signal ADC_in in the discrete-time manner, and holds it for a sampling period. In the embodiment 2, the A/D converter 1 has a configuration which shares the sample hold circuit 170 and the hold signal generating circuit 150. Since the embodiment 2 is similar to the embodiment 1 except for this configuration, explanation of similar points thereof is omitted. Hereinafter, the embodiment 2 is explained centering on a difference between the embodiment 2 and the embodiment 1.

A circuit diagram of a sample hold circuit 170A is illustrated in FIG. 18. The sample hold circuit 170A includes the input buffer 101, the feedback capacitors 102 and 103, the input switches 108 and 109, the input terminals 112 and 113, and switches 171 to 174. The feedback capacitors 102 and 103 are arranged between the input and the output of the input buffer 101, similarly to the embodiment 1. Additionally, the sample hold circuit 170A and the hold signal generating circuit 150 share the feedback capacitors 102 and 103, and the input buffer 101.

One end of the switch 171 is coupled to one input of the input buffer 101 and the feedback capacitor 102. A voltage Vcm is supplied to the other end of the switch 171. One end of the switch 172 is coupled to the other input of the input buffer 101 and the feedback capacitor 103. The voltage Vcm is supplied to the other end of the switch 172. The switch 173 is coupled to the feedback capacitor 102 and one end of the input switch 108. The switch 174 is coupled to the feedback capacitor 103 and one end of the input switch 109. The voltage Vcm is the voltage within a range of an operation voltage of the input buffer 101 and is, for example, a voltage HVDD of one half of the power supply voltage VDD of the input buffer 101. The feedback capacitor 102 is coupled in series between the input of the input buffer 101 and the input switch 108. The input terminal 112 is coupled to the input buffer 101 through the input switch 108 and the feedback capacitor 102. The feedback capacitor 103 is coupled in series between the input of the input buffer 101 and the input switch 109. The input terminal 113 is coupled to the input buffer 101 through the input switch 109 and the feedback capacitor 103.

At the time of the actual A/D conversion operation, the input switches 108 and 109 and the switches 171 and 172 are opened and closed according to a clock signal $\phi 1$, and the switches 173 and 174 are opened and closed according to a clock signal $\phi 2$. Consequently, when the switches 173 and 174 are closed, the output of the input buffer 101 is coupled to the feedback capacitors 102 and 103, and when the switches 173 and 174 are opened, the output of the input buffer 101 is uncoupled from the feedback capacitors 102 and 103. In addition, when the switches 171 and 172 are closed, the voltage Vcm is supplied to the input of the input buffer 101. The clock signal $\phi 1$ and the clock signal $\phi 2$ are the clock signals having the same frequency and having different phases by 180° as illustrated in FIG. 18. Consequently, when the clock signal $\phi 1$ is at an H level, the clock signal $\phi 2$ is at an L level. When the clock signal $\phi 2$ is at the H level, the clock signal $\phi 1$ is at the L level.

At the time of the A/D conversion test operation, by the mode signal (Mode), the input switches 108 and 109 and the switches 171 and 172 are opened, and the switches 173 and 174 are closed. The feedback capacitor 102 is coupled to the switch 173 in series between the one input and output of the input buffer 101. The feedback capacitor 103 is coupled to the switch 174 in series between the other input and output of the input buffer 101. The sampling circuit 130 charges the feedback capacitors 102 and 103 in the discrete-time manner similarly to the embodiment 1. At the time of the A/D conversion test operation, processing similar to that of the embodiment 1 is carried out. Consequently, an effect similar to that of the embodiment 1 can be obtained. For example, similarly to that of the embodiment 1, highly accurate calibration can be realized by a semiconductor having low electric power and a small area.

Furthermore, in the embodiment, the semiconductor integrated circuit device includes the sample hold circuit 170 arranged at the input side of the A/D conversion unit 2A. Additionally, the capacitors provided in the sample hold circuit 170 are shared as the feedback capacitors 102 and 103. According to this configuration, increase of the circuit area can be suppressed. The input buffer 101 of the sample hold circuit 170 is shared as the input buffer 101 of the hold signal generating circuit 150. According to this configuration, the increase of the circuit area can be suppressed.

MODIFIED EXAMPLE

A configuration of the modified example of the embodiment 2 is explained using FIG. 19. FIG. 19 is a circuit diagram illustrating the configuration of the modified example. In the modified example illustrated in FIG. 19, arrangement of switches is different compared with that FIG. 18. Since a basic configuration of the buffer unit 4C is similar to the above-described configuration, an explanation thereof is omitted.

A sample hold circuit 170B according to the modified example 1 includes switches 181 to 184 in lieu of the switches 173 and 174 illustrated in FIG. 18. Furthermore, the sample hold circuit 170B includes input capacitors 185 and 186. In addition, similarly to the embodiment 1, the sample hold circuit 170B includes the selector switches 106 and 107. An explanation of a configuration similar to those of the embodiments 1 and 2 is appropriately omitted.

One end of the switch 181 is coupled to the input of the input buffer 101. The other end of the switch 181 is coupled to the one end of the switch 171 and the input capacitor 185. Accordingly, the switch 181 is connected in series between the input of the input buffer 101 and the input capacitor 185. One end of the switch 182 is coupled to the input of the input buffer 101. The other end of the switch 182 is coupled to the one end of the switch 172 and the input capacitor 186. Accordingly, the switch 182 is connected in series between the input of the input buffer 101 and the input capacitor 186. The switches 181 and 182 cause the input buffer 101 to be uncoupled from the input capacitors 185 and 186.

Accordingly, the input switch 108, the input capacitor 185, and the switch 181 are coupled in series between the input terminal 112 and the inverting input terminal of the input buffer 101. The input switch 109, the input capacitor 186, and the switch 182 are coupled in series between the input terminal 113 and the noninverting input terminal of the input buffer 101.

One end of the switch 183 is coupled to the one end of the input switch 108 and the input capacitor 185. The voltage Vcm is supplied to the other end of the switch 183. One end of the switch 184 is coupled to the one end of the input switch 109 and the input capacitor 186. The voltage Vcm is supplied to the other end of the switch 184.

At the time of the actual A/D conversion operation, the selector switches 106 and 107 are opened and closed according to the clock signal φ1. In addition, at the time of the actual A/D conversion operation, the input switches 108 and 109, and the switches 171 and 172 are opened and closed according to a clock signal φ1'. At the time of the actual A/D conversion operation, the switches 181 and 182 are opened and closed according to the clock signal φ2, and the switches 183 and 184 are opened and closed according to a clock signal φ2'. The clock signal φ1 and the clock signal φ2 are the clock signals having the same frequency and having different phases by 180 degrees as illustrated in a lower part of FIG. 19. The clock signal φ1 and the clock signal φ1' are the clock signals having the same frequency and the same phase. The clock signal φ2 and the clock signal φ2' are the clock signals having the same frequency and the same phase. Consequently, when the clock signals φ1 and φ1' are at the H level, the clock signals φ2 and φ2' are at the L level. When the clock signals φ2 and φ2' are at the H level, the clock signals φ1 and φ1' are at the L level.

At the time of the A/D conversion test operation, by the mode signal (Mode), the input switches 108 and 109 and the switches 181 and 182 are opened. The feedback capacitor 102 is arranged between the one input and output of the input buffer 101. The feedback capacitor 103 is arranged between the other input and output of the input buffer 101. The sampling circuit 130 charges the feedback capacitors 102 and 103 in the discrete-time manner similarly to the embodiment 1. At the time of the A/D conversion test operation, processing similar to that of the embodiment 1 is carried out. Consequently, an effect similar to that the embodiment 1 can be obtained. For example, similarly to those of the embodiments 1 and 2, highly accurate calibration can be realized by semiconductor having low electric power and a small area.

Furthermore, a part of the sample hold circuit 170B can be shared with the hold signal generating circuit 150. For example, the SC integrator 160 shares the feedback capacitors 102 and 103 provided in the sample hold circuit 170B. The SC integrator 160 shares the input buffer 101 of the sample hold circuit 170. According to this configuration, increase of the circuit area can be suppressed.

Embodiment 3

Figure 20:
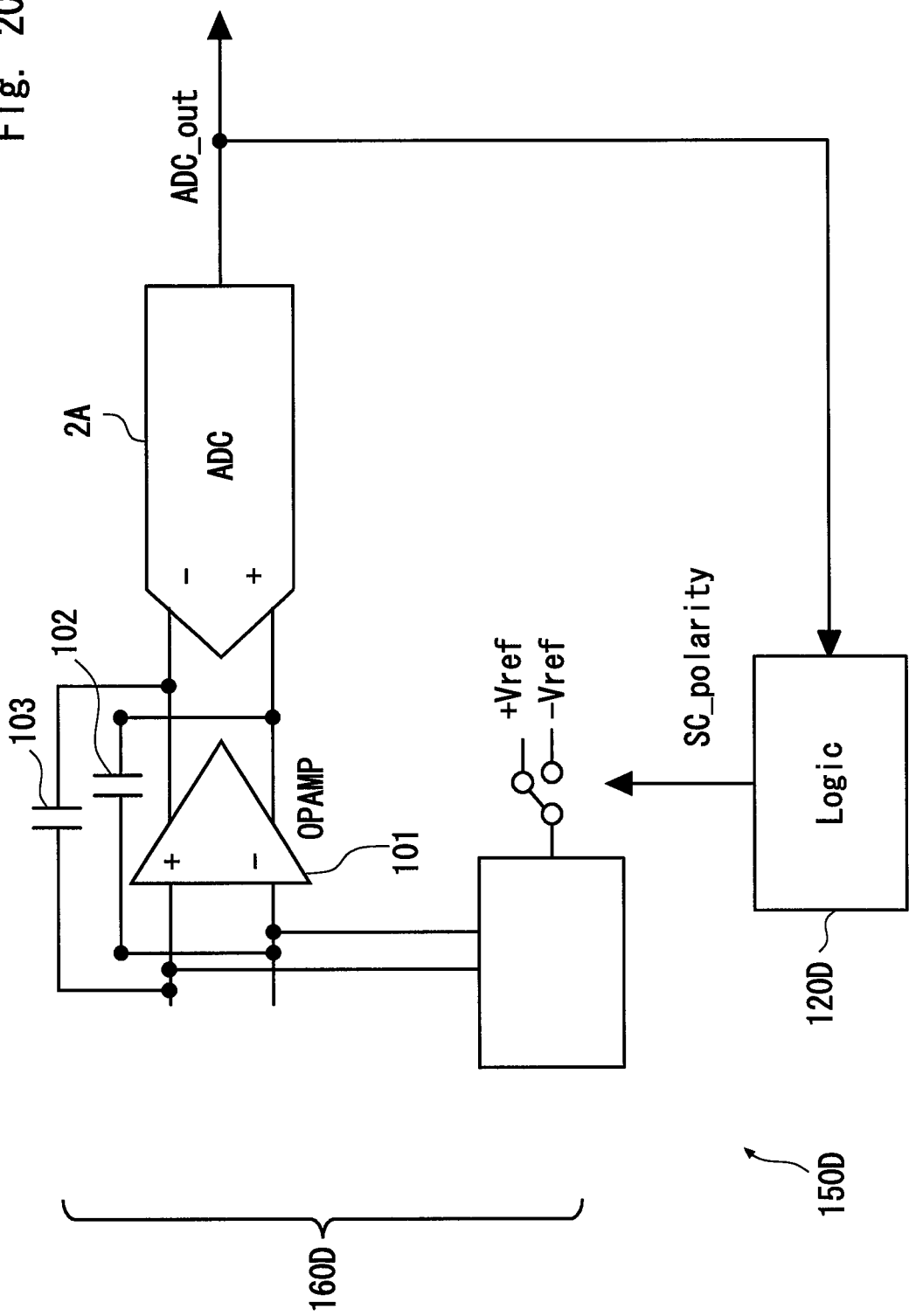
FIG. 20 illustrates a semiconductor device according to a third embodiment.

A semiconductor device according to the embodiment is explained using FIG. 20. The semiconductor device includes the A/D conversion unit 2A and a signal generating circuit 150D. The signal generating circuit 150D is coupled to the input side of the A/D conversion unit 2A, and has a hold period not less than two cycles of the A/D conversion unit 2A. The signal generating circuit 150D includes a discrete type integrator 160D and a logic circuit 120D. The discrete type integrator 160D includes the input buffer 101 coupled to the input side of the A/D conversion unit 2A, and the feedback capacitors 102 and 103 coupled to the input and the output of the input buffer 101. The logic circuit 120D compares an output signal of plural bits outputted from the A/D conversion unit with first and second threshold values, and outputs a control signal SC_polarity which controls polarity of the discrete type integrator 160D according to a comparison result. As a result of this, similarly to the embodiments 1 and 2, highly accurate calibration can be realized by semiconductor having low electric power and a small area.

Other Embodiments

The hold signal generating circuit 150 and the signal generating circuit 150D which have been shown in the embodiments 1 to 3 are suitable for application to the successive approximation register A/D converter and the pipeline type A/D converter. As a result of this, calibration can be performed accurately. Of course, the hold signal generating circuit 150 and the signal generating circuit 150D can also be applied to A/D converters other than the successive approximation register A/D converter and the pipeline type A/D converter.

The buffer unit 4C shown in the embodiments 1 and 2 serves as the holding unit 4 of FIG. 1. Similarly, the signal generating circuit 150D of the embodiment 3 configures the holding unit 4. Additionally, the semiconductor integrated circuit device 10 includes the digital correction unit 3 which receives the digital output from the A/D conversion unit 2 to perform digital correcting thereof, and thereby outputs an A/D conversion result as illustrated in FIG. 1 etc. The holding unit 4 holds a test signal with respect to the A/D conversion unit 2. The A/D conversion unit 2 is of the charge sharing type and performs successive approximation. At the time of a test operation, the test signal having the same analog value from the holding unit 4 is inputted into the A/D conversion unit 2 in a first period and a second period different therefrom, a first dither signal is inputted into the A/D conversion unit 2 in the first period, and an A/D conversion correction coefficient is determined on the basis of a first digital correction result in the digital correction unit 3 with respect to a first digital output from the A/D conversion unit 2 in the first period, and a second digital correction result in the digital correction unit 3 with respect to a second digital output from the A/D conversion unit 2 in the second period. At the time of a normal operation, digital correcting is performed using the A/D conversion correction coefficient calculated at the time of the test. In a manner as described above, digital correction can be performed accurately.

Hereinbefore, although the invention made by the present inventors has been specifically explained on the basis of the embodiments, the present invention is not limited to the already described embodiments, and it is needless to say that various changes can be made without departing from the scope of the invention.

While the invention has been described in terms of several embodiments, those skilled in the art will recognize that the invention can be practiced with various modifications within the spirit and scope of the appended claims and the invention is not limited to the examples described above.

Further, the scope of the claims is not limited by the embodiments described above.

Furthermore, it is noted that, Applicant's intent is to encompass equivalents of all claim elements, even if amended later during prosecution.

What is claimed is:

1. A semiconductor device comprising:
   an A/D conversion unit; and
   a signal generating circuit which is coupled to an input side of the A/D conversion unit, and has a hold period not less than two cycles of the A/D conversion unit,
   wherein the signal generating circuit includes:
      a discrete type integrator including an input buffer coupled to the input side of the A/D conversion unit, and a feedback capacitor coupled to an input and an output of the input buffer; and
      a circuit which compares an output signal of plural bits outputted from the A/D conversion unit with first and second threshold values, and outputs a control signal which controls polarity of the discrete type integrator according to a comparison result.

2. The semiconductor device according to claim 1, wherein the control signal is a 1-bit digital signal,
   when the output signal outputted from the A/D conversion unit exceeds the first threshold value, the control signal becomes a first value, and
   when the output signal outputted from the A/D conversion unit is below the second threshold value lower than the first threshold value, the control signal becomes a second value.

3. The semiconductor device according to claim 2, wherein when the output signal exceeds the first threshold value, polarity of the discrete type integrator is set to be negative,
   when the output signal is below the second threshold value, the polarity of the discrete type integrator is set to be positive, and
   when the output signal falls between the first threshold value and the second threshold value, the polarity of the discrete type integrator is maintained as it is.

4. The semiconductor device according to claim 1 further comprising a sample hold circuit which is arranged at the input side of the A/D conversion unit, and shares the input buffer and the feedback capacitor.

5. The semiconductor device according to claim 1, further comprising:
   an input terminal provided at an input side of the input buffer; and
   an input switch which is arranged between the input terminal and the input buffer, and causes the input terminal and the input buffer to be uncoupled from each other,
   wherein the discrete type integrator operates in a state where the input terminal and the input buffer are uncoupled from each other.

6. The semiconductor device according to claim 5, wherein the input switch is opened and closed by a mode signal which switches a test operation for calibrating the A/D conversion unit, and an actual operation in which the A/D conversion unit performs A/D conversion of an input signal inputted into the input terminal.

7. The semiconductor device according to claim 6, further comprising:
   a feedback resistor coupled to the feedback capacitor in parallel between the input and the output of the input buffer; and
   a selector switch which causes the input of the input buffer and the feedback resistor to be uncoupled from each other at a time of the test operation.

8. The semiconductor device according to claim 6, further comprising a switch arranged between the feedback capacitor and the output of the input buffer, wherein
   at a time of the test operation, the switch is closed and the feedback capacitor and the output of the input buffer are coupled to each other, and
   at a time of the actual operation, the switch performs an opening and closing operation.

9. The semiconductor device according to claim 6, further comprising:
   a capacitor coupled between the input switch and the input of the input buffer; and
   a switch coupled between the capacitor and the input of the input buffer, wherein
   at a time of the test operation, the switch is opened and the capacitor and the input buffer are uncoupled from each other, and
   at a time of the actual operation, the switch is opened and closed.

10. The semiconductor device according to claim 1, wherein the discrete type integrator includes:
   a first switch which is opened and closed in a cycle not less than two cycles of the A/D conversion unit;
   a capacitor coupled to one end of the first switch; and
   a second switch whose one end is coupled to the one end of the first switch and the capacitor, whose other end is coupled to the feedback capacitor and the input side of the input buffer, and the second switch being opened and closed alternately with the first switch.

11. The semiconductor device according to claim 1, wherein the A/D conversion unit is a pipeline type A/D conversion unit.

12. The semiconductor device according to claim 1, wherein the A/D conversion unit is a successive approximation register A/D conversion unit.

13. The semiconductor device according to claim 1, further comprising:
 a digital correction unit which receives a digital output from the A/D conversion unit to perform digital correcting thereof, and thereby outputs an A/D conversion result; and
 a holding unit which holds a test signal with respect to the A/D conversion unit, wherein
  the A/D conversion unit is of a charge sharing type and performs successive approximation,
  at the time of a test operation, the test signal having the same analog value from the holding unit is inputted into the A/D conversion unit in a first period and a second period different therefrom, a first dither signal is inputted into the A/D conversion unit in the first period, and an A/D conversion correction coefficient is determined on the basis of a first digital correction result and a second digital correction result, the first digital correction result being a digital correction result in the digital correction unit with respect to a first digital output from the A/D conversion unit in the first period, and the second digital correction result being a digital correction result in the digital correction unit with respect to a second digital output from the A/D conversion unit in the second period, and
  at the time of an actual operation, the digital correcting is performed using the A/D conversion correction coefficient determined at the time of the test operation.

14. The semiconductor device according to claim 1, wherein:
 when the output signal outputted from the A/D conversion unit exceeds the first threshold value, the control signal becomes a first value; and
 when the output signal outputted from the A/D conversion unit is below the second threshold value, lower than the first threshold value, the control signal becomes a second value.

15. The semiconductor device according to claim 1, further comprising a holding unit, wherein:
 a test signal having a constant analog value from the holding unit is inputted into the A/D conversion unit in a first period and a second period, different from the first period; and
 a dither signal is inputted into the A/D conversion unit in at least one of the first period or the second period.

16. A semiconductor device comprising:
 an A/D conversion unit; and
 a signal generating circuit which is coupled to an input side of the A/D conversion unit, and has a hold period not less than two cycles of the A/D conversion unit,
 wherein the signal generating circuit includes:
  a discrete type integrator including an input buffer coupled to the input side of the A/D conversion unit, a first feedback capacitor coupled to a first input and a first output of the input buffer, and a second feedback capacitor coupled to a second input and a second output of the input buffer; and
  a circuit which compares an output signal of plural bits outputted from the A/D conversion unit with first and second threshold values, and outputs a control signal which controls polarity of the discrete type integrator according to a comparison result.

* * * * *